United States Patent [19]

Bang

[11] Patent Number: 5,128,966
[45] Date of Patent: Jul. 7, 1992

[54] SYSTEM FOR DEMODULATING FREQUENCY- OR PHASE-MODULATED SIGNALS BY QUADRATURE-PHASE

[75] Inventor: Sa-Hyun Bang, Seoul, Rep. of Korea

[73] Assignee: SamSung Electronics Co., Ltd., Suwon, Rep. of Korea

[21] Appl. No.: 310,529

[22] Filed: Feb. 15, 1989

[51] Int. Cl.$^5$ .............................................. H03D 3/00
[52] U.S. Cl. ........................................ 375/82; 375/83; 375/88; 329/302; 329/306; 455/214
[58] Field of Search .................. 375/79, 81, 82, 83, 375/84, 86, 88; 329/306, 302, 321, 323, 327, 361; 455/205, 209, 214, 216

[56] References Cited

U.S. PATENT DOCUMENTS

| | | | |
|---|---|---|---|
| 4,083,009 | 4/1978 | Bickford et al. | 375/83 |
| 4,577,157 | 3/1986 | Reed | 375/82 |
| 4,674,105 | 6/1987 | Suzuki | 375/80 |
| 4,682,117 | 7/1987 | Gibson | 375/80 |
| 4,736,392 | 4/1988 | Kammeyer et al. | 375/80 |
| 4,755,761 | 7/1988 | Ray | 375/78 |
| 4,879,728 | 11/1989 | Tarallo | 375/80 |
| 4,888,793 | 12/1989 | Chanroo et al. | 375/83 |
| 4,912,422 | 3/1990 | Kobayashi et al. | 375/83 |

*Primary Examiner*—Benedict V. Safourek
*Assistant Examiner*—Young Tse
*Attorney, Agent, or Firm*—Robert E. Bushnell

[57] ABSTRACT

A system for digitally demodulating a frequency- or phase- modulated signal by mixing a carrier wave of the modulated signal and a local oscillation signal so as to produce first and second analog signals of quadrature-phase intermediate frequency having a phase difference of 90 degrees, the system comprising: a phase-digital converter for detecting the variation of a fixed phase period of the first and second analog signals to produce a signal for establishing the period of a quantization step; an interface device for producing variable phased information for the pertinent quantization step according to the phase relationship of the phase-digital signal; and signal processor for storing the quantized phase information of the interface, accumulating, by a sampling signal of a fixed period, the variable phase information stored during the sampling period, thereby demodulating the modulated signal.

14 Claims, 23 Drawing Sheets

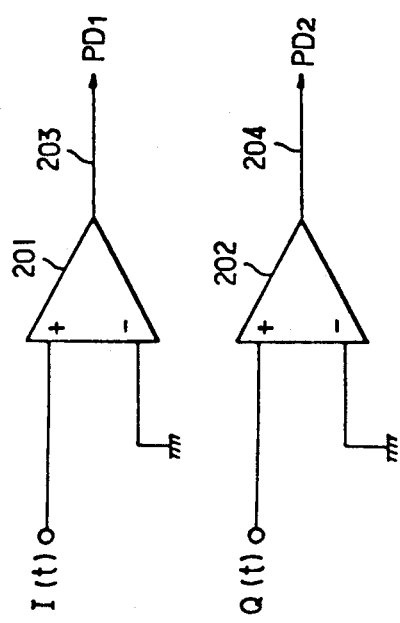
F I G. 4

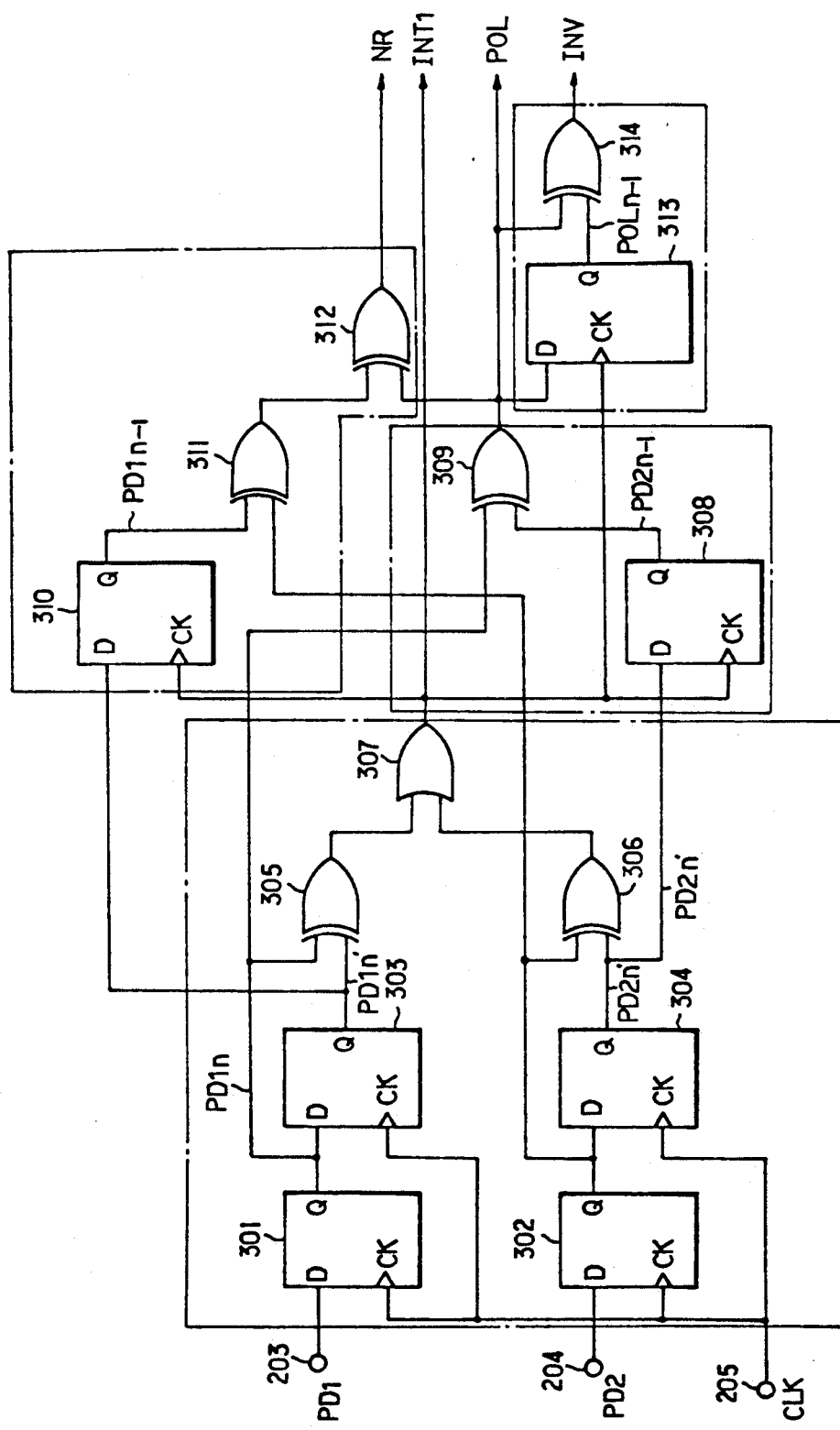
F I G. 6

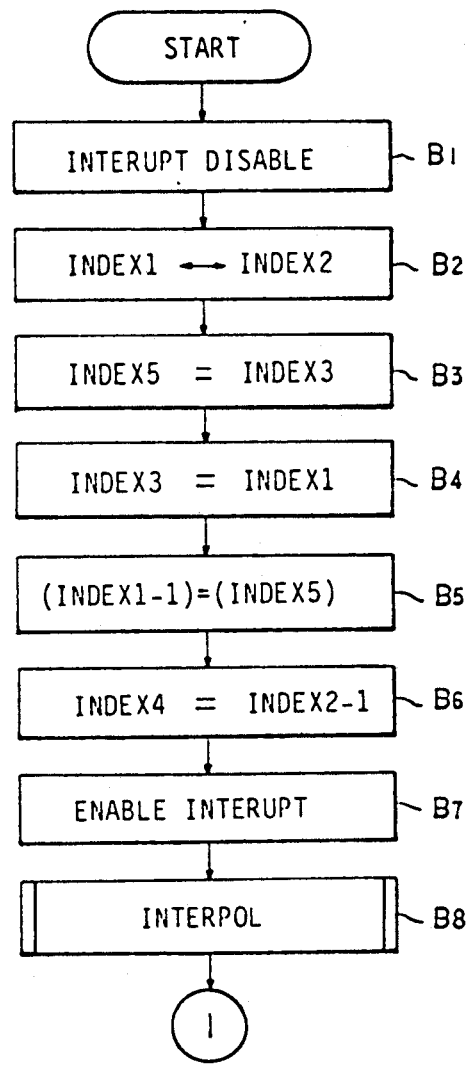
F I G. 13

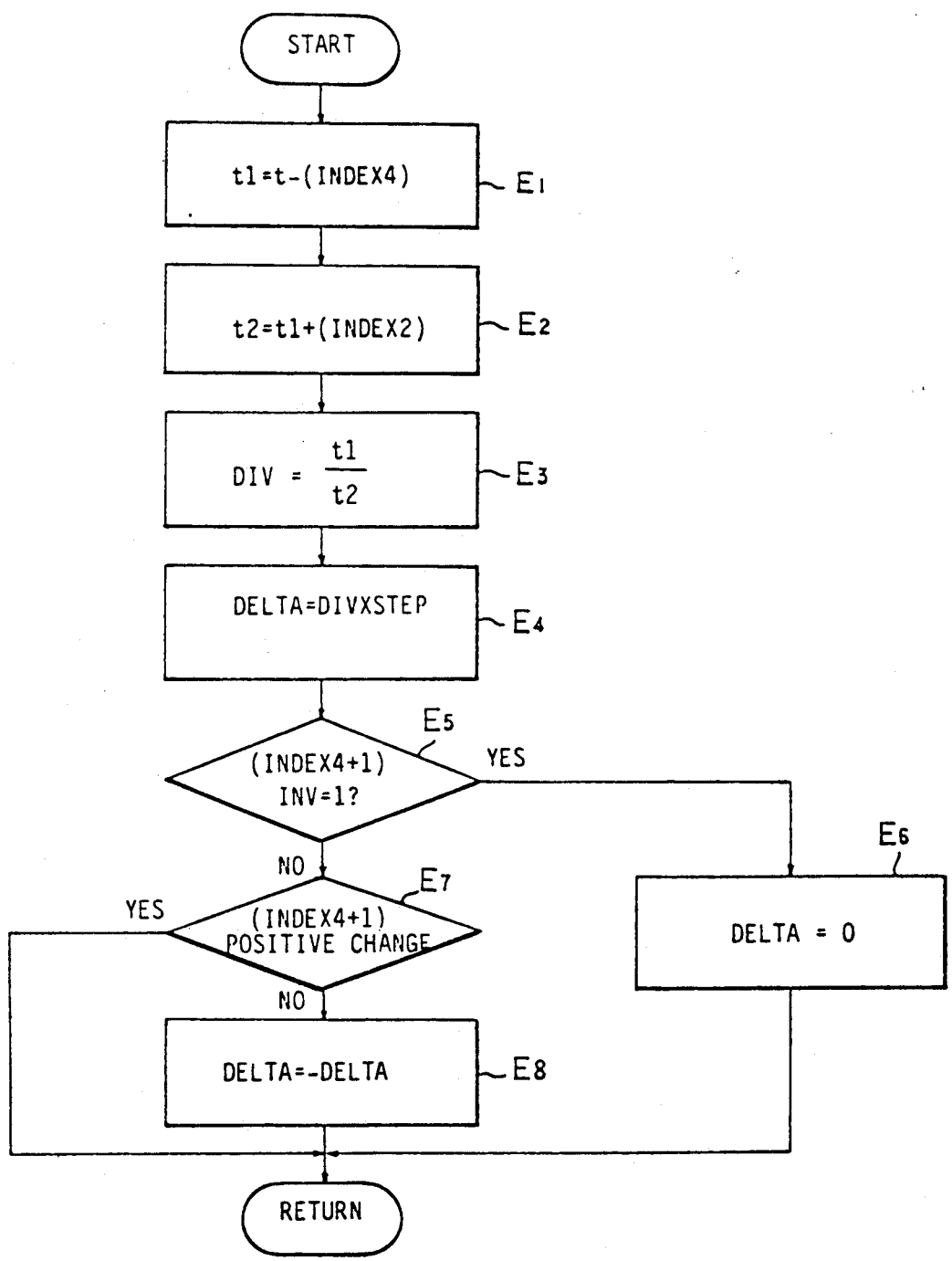
F I G. 14

| INV | NR | POL | C7 | C6 | C5 | C4 | C3 | C2 | C1 | Co |
|---|---|---|---|---|---|---|---|---|---|---|
| D10 | D9 | D8 | D7 | D6 | D5 | D4 | D3 | D2 | D1 | D0 |

| |
|---|
| INDEX1 −1 |
| INDEX1 0 |
| INDEX1 +1 |
| INDEX1 +2 |
| INDEX1 +3 |
| INDEX1 +4 ← INDEX5 |
| INDEX1 +5 |
| INDEX1 +6 |
| INDEX1 +7 |
| INDEX1 +8 |
| INDEX1 +9 |
| INDEX1 +10 |
| INDEX1 +11 |
| INDEX1 +12 |
| INDEX1 +13 |
| INDEX1 +14 |

(B)

| |
|---|
| INDEX2 −1 |
| INDEX2 0 |
| INDEX2 +1 |
| INDEX2 +2 |
| INDEX2 +3 |
| INDEX2 +4 |
| INDEX2 +5 |
| INDEX2 +6 |
| INDEX2 +7 |
| INDEX2 +8 |
| INDEX2 +9 |
| INDEX2 +10 |
| INDEX2 +11 |
| INDEX2 +12 |
| INDEX2 +13 |
| INDEX2 +14 |

FIG.16

SYSTEM FOR DEMODULATING FREQUENCY- OR PHASE-MODULATED SIGNALS BY QUADRATURE-PHASE

TECHNICAL BACKGROUND

The present invention relates to a system for demodulating a frequency- or phase-modulation signal, and more particularly a system for digitally demodulating the received modulation signal by quantizing phase information of a fixed period detected by using two local frequency signals of quadrature-phase, wherein the two local signals have the same frequency as the carrier wave of the modulation signal.

Generally, the FM(Frequency Modulation) receiver demodulates the modulated signal by using a superheterodyne system as shown in FIG. 1. In the superheterodyne system, first mixer 4 mixes the received RF(Radio Frequency) signal with a first local oscillation signal LS1 generated by a first local oscillator 3 so as to form a first intermediate frequency (IF) signal, and first IF filter eliminates unwanted signals such as harmonics, etc. produced when the received RF signal and the first local oscillation signal are mixed in the first mixer 4. Also, the first IF filter generates the first IF signal IF1. Additionally, a second mixer 7 mixes the IF signal IF1 with a second local oscillation signal LS2 generated by a second local oscillator 6 to form a second IF signal IF2, and a second IF filter 8 eliminates the adjacent frequency in order to sensitively distinguish the adjacent channel, outputting the second IF signal IF2. Here, the first IF signal IF1 is usually a high frequency of several tens to several hundred MHz and the second IF signal IF2 is a relatively low frequency. An FM demodulator 9 demodulates the second IF signal IF2 to reproduce the original message signal. Because the conventional superheterodyne system as described above demodulates the received RF signal by using two local oscillators, automatic frequency control (AFC) is hardly realized to control the frequency deviation between the input signal and the local oscillation signal, the first IF filter requires a large size and high cost in order to filter the frequency of several tens of MHz. Furthermore, the conventional method makes it difficult to obtain a constant group delay characteristic according to frequencies used in data communication, and has a problem in integration and reduction of the system.

Another method or demodulating a frequency- or phase-modulated signal is as shown in FIG. 2, which illustrates an FM detecting system of analog method using quadrature phase, disclosed by I. A. W. Vance. (see, I. A. W. Vance, An Integrated Circuit VHF Radio receiver, proceedings of the IERE Conference on Land, Mobil Radio, Sep. 4-7, 1979). This system comprises an antenna 11 for receiving a modulated signal, a local oscillator 13 for generating a signal of the same frequency as the carrier wave of the received RF signal, a phase shifter 14 for shifting, by 90°, the phase of the local oscillation frequency of said local oscillator 13, an in-phase mixer 15 (hereinafter referred to as I-mixer) for mixing the received RF signal and the local oscillation frequency outputted through said phase shifter 14, a quadrature-phase mixer 16 (hereinafter referred to as Q-mixer) for mixing the received RF signal and the local oscillation frequency of the local oscillator 13, first and second low-pass-filters (hereinafter referred to as LPF) 17, 18 for filtering the outputs of the I-mixer 15 and Q-mixer 16 into a half bandwidth of the RF channel band, first and second variable gain amplifiers 19, 20 for variably amplifying the outputs of the first and second LPFs 17, 18, a level detector 21 for detecting the output level of the first and second variable gain amplifiers 19, 20, to deliver an automatic gain control (AGC) signal to the first and second variable gain amplifiers 19, 20, a first differentiator 22 for differentiating an I-channel gain control IF signal of the first variable gain amplifier 19, a second differentiator 23 for differentiating a Q-channel gain control IF signal of the second variable gain amplifier 20, an I-multiplier 24 for multiplying the I-channel gain control signal of the first variable gain amplifier 19 and the Q-channel differentiated signal of the second differentiator 23, a Q-multiplier 25 for multiplying the Q-channel gain control signal of the second variable gain amplifier 20 and the I-channel differentiated signal of the first differentiator 22, and a subtractor 26 for performing a subtracting operation from the outputs of said I-multiplier 24 and Q-multiplier 25, thereby outputting a demodulation signal.

In such a demodulation system of the quadrature-phase or -frequency modulation signal using analog method, the phase error originating from the two channels is outputted as its cosine function signal affecting only the amplitude thereof. But if non-equilibrium exists between the I-multiplier 24, Q-multiplier 25, and subtractor 26, the output signal is distorted. Furthermore, since the signals I(t) and Q(t) have a wide dynamic range from direct current (DC) to cutoff frequency of the LPF, it is difficult to realize the operation AGC through ideally detecting the level. Also, all the amplitude variations produced following the AGC operation turn into AM (Amplitude Modulation) noises. On the other hand, since all the steps are processed by the analog method, there appears a problem that the two channels must always be precisely matched with each other in its original integration, thereby decreasing its reliability.

SUMMARY OF THE INVENTION

It is an object of the preset invention to provide a system for demodulating a frequency- or phase-modulated signal using the digital method, by a quantization phase information of a fixed period derived from two local frequency signals of quadrature-phase with the carrier wave of the received RF signal.

It is another object of the present invention to provide a system for detecting the quantization period information by a digital signal of the quantization period. This is obtained by converting the phase relationship of two local frequencies in order to digitally demodulate a phase- or frequency demodulated signal, and the method thereof.

It is still another object of the present invention to provide a system for demodulating the received IF signal by the quantization information stored at every fixed sampling period, and the method thereof.

It is a further object of the present invention to provide a system for eliminating AM noises by using the signal which is obtained by converting a fixed phase interval into digital values, without a separate level detecting circuit, and the method thereof.

According to the present invention, a system for digitally demodulating a frequency- or phase-modulated signal comprises a phase-digital converter for detecting the variation of a fixed phase period of first and second analog signals to produce a signal for establishing the period of a quantization step, and an interface for producing phase shift information for the pertinent quantization step according to the phase relationship of the phase digital signal, whereby the quantized phase information of the interface is stored, and by a sampling signal of a fixed period is said variable phase information is stored for the pertinent sampling period are accumulated.

The present invention will now be described in more detail with reference to the drawings attached only by way of example.

BRIEF DESCRIPTION OF THE ATTACHED DRAWINGS

FIG. 4 is an example of a phase-digital converter 200 for converting every $\pi/2$ phase into a digital signal;

FIG. 6 is an example of an interface 300 for producing quantization information at every $\pi/2$ phase period in FIG. 3;

Figure 13:
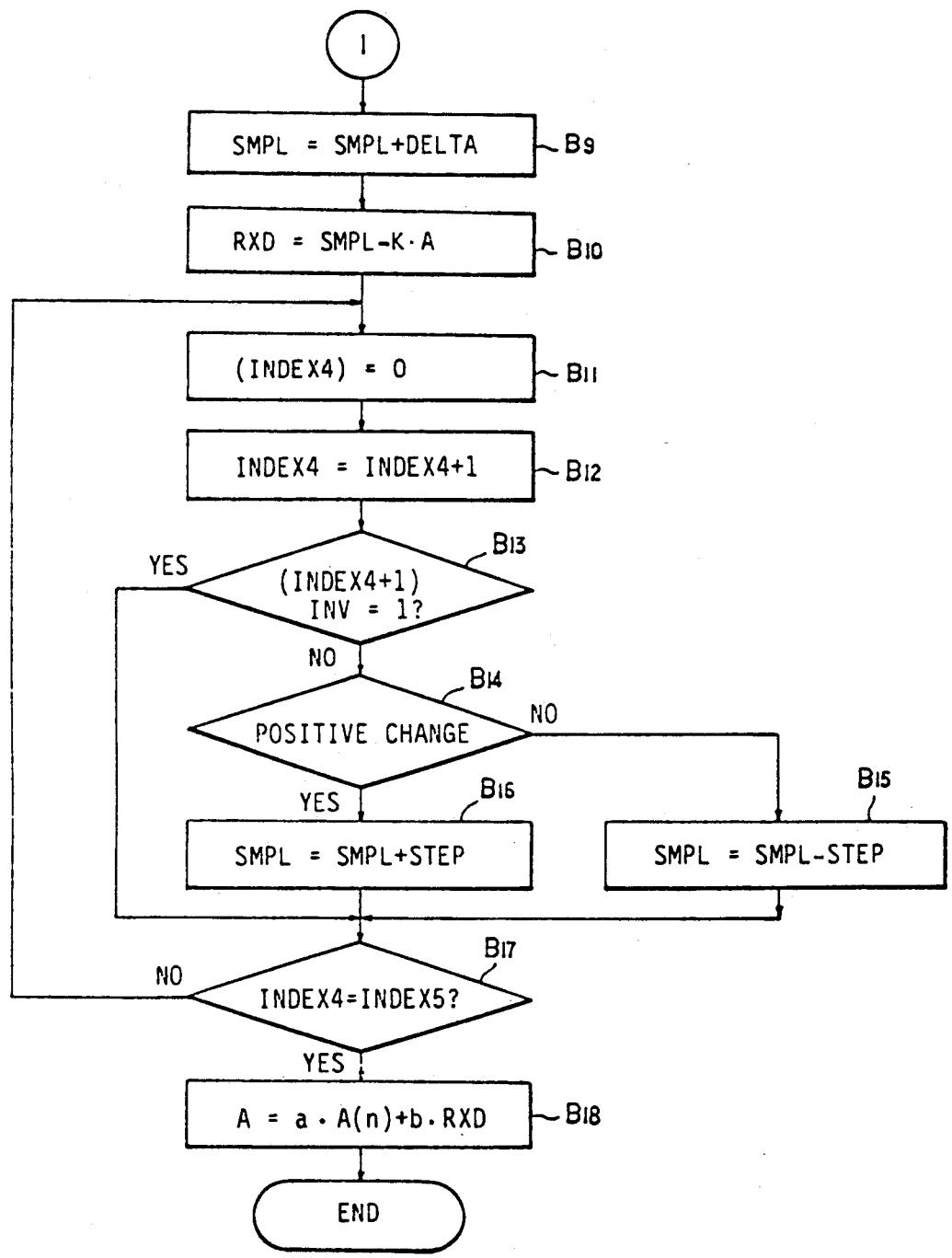
Figure 17:
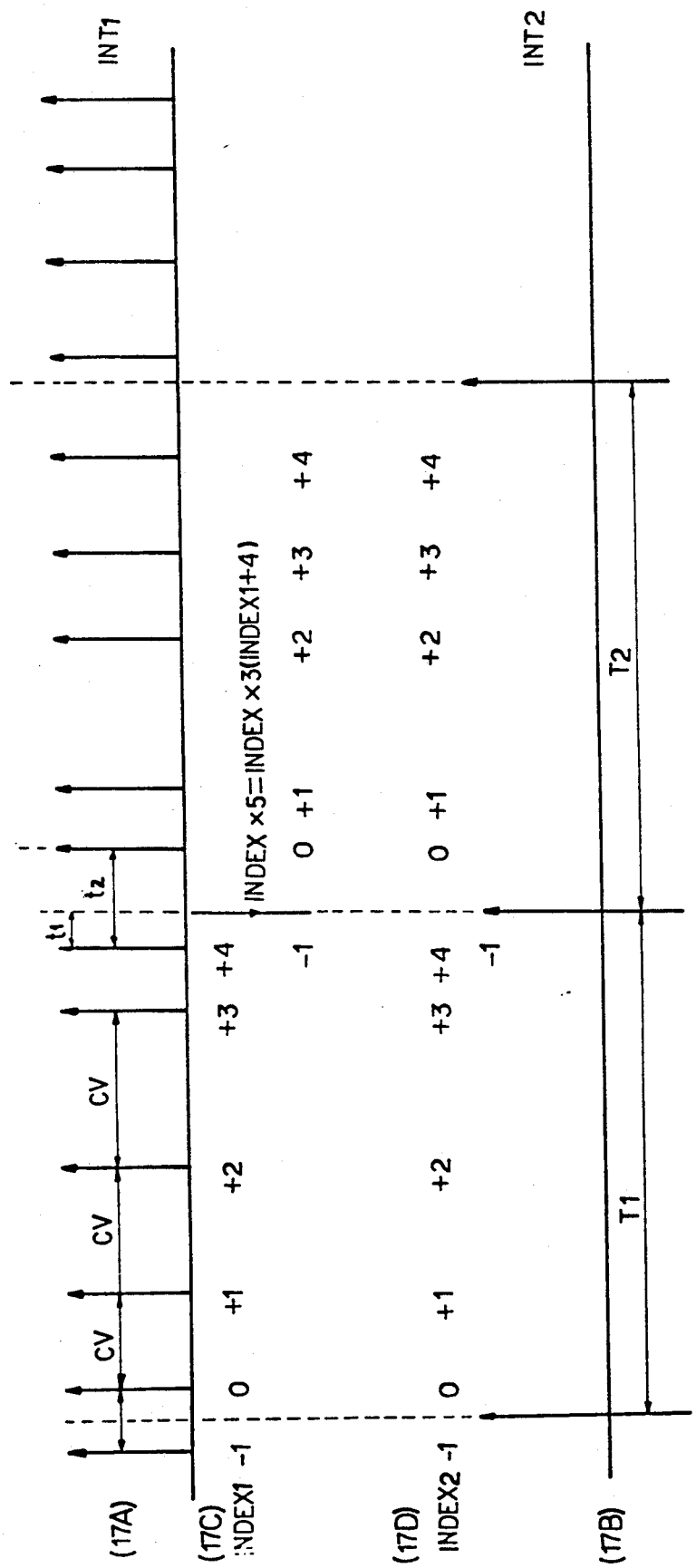
Figure 18:
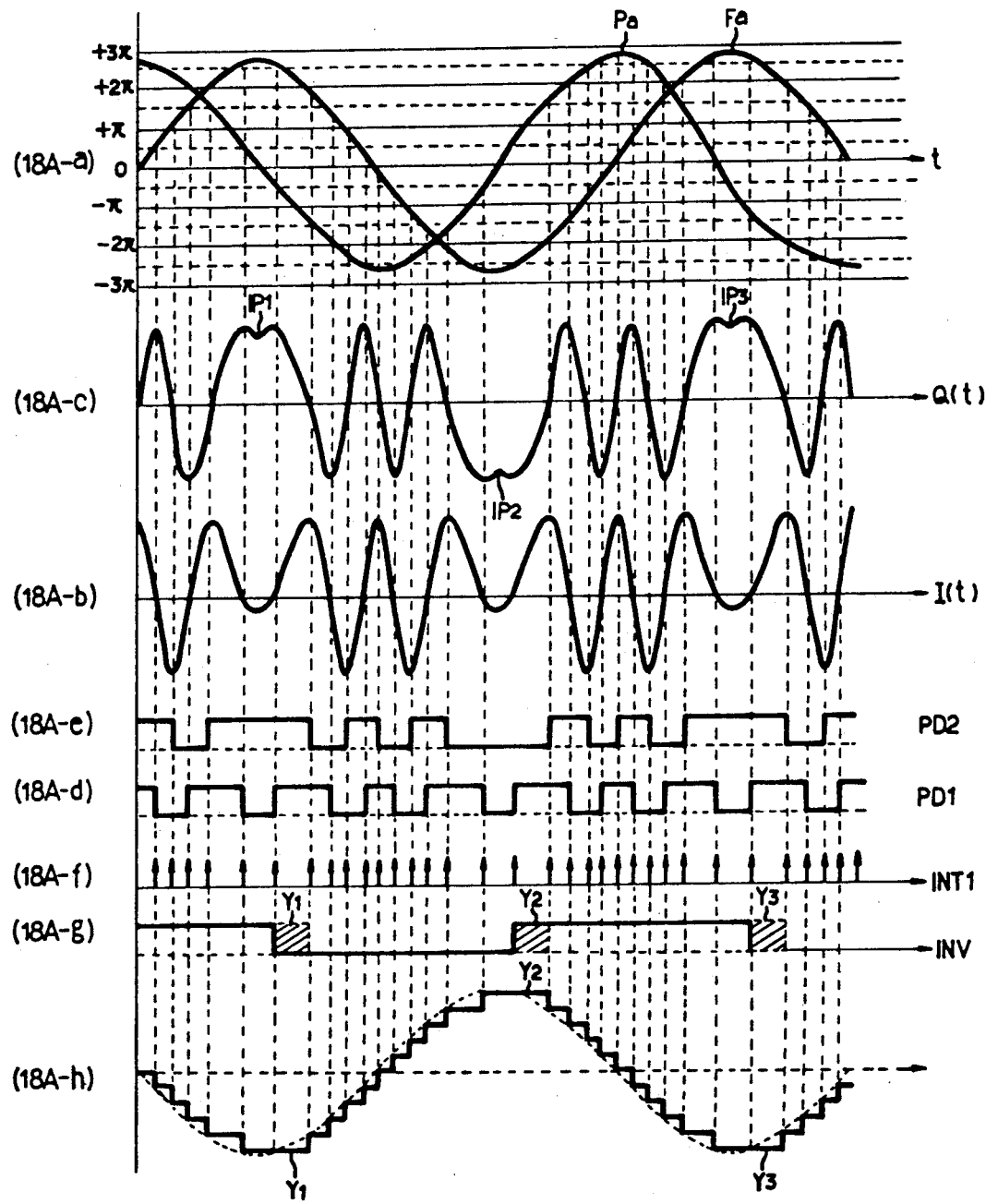
Figure 18B:
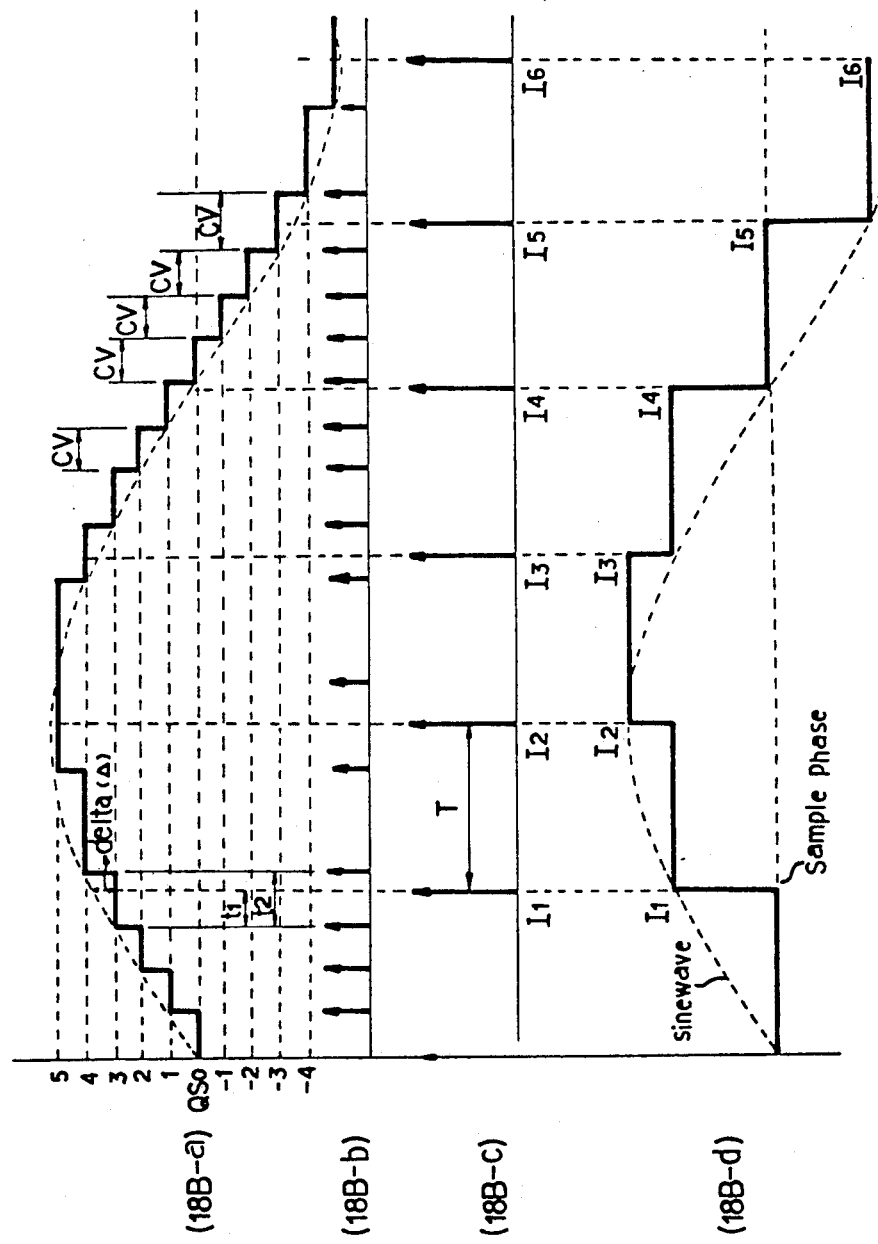
Figure 19:
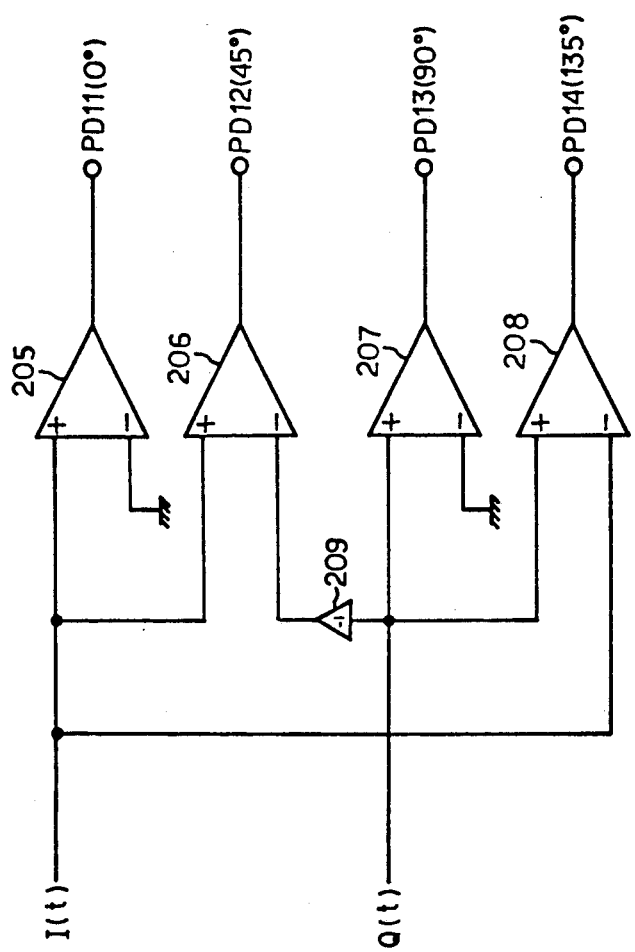
Figure 20:
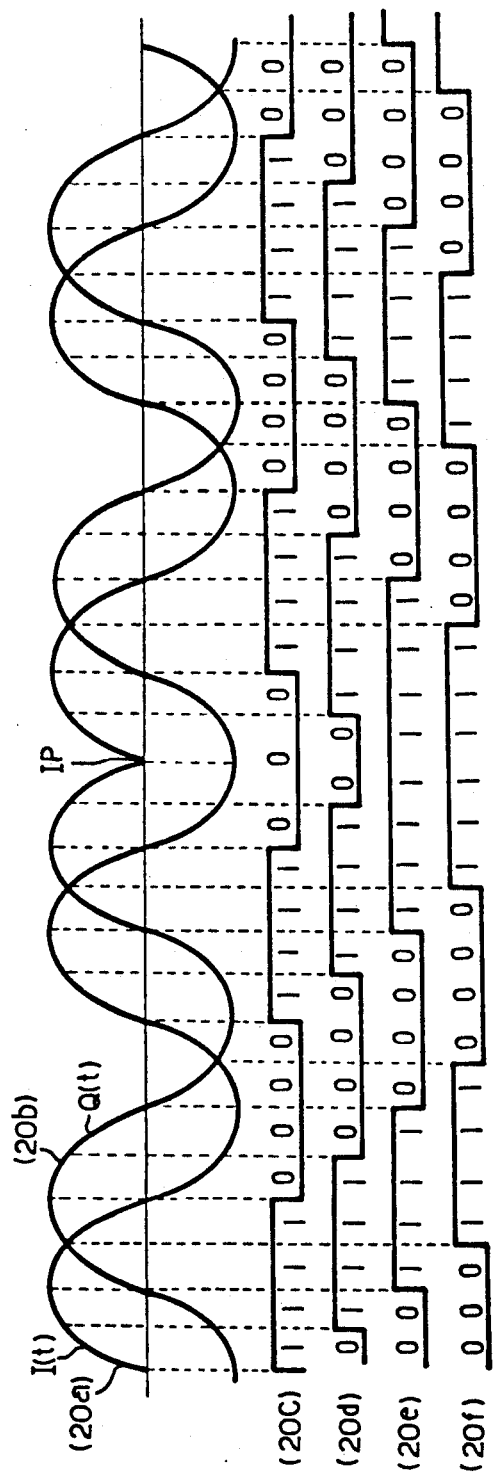
Figure 21A:
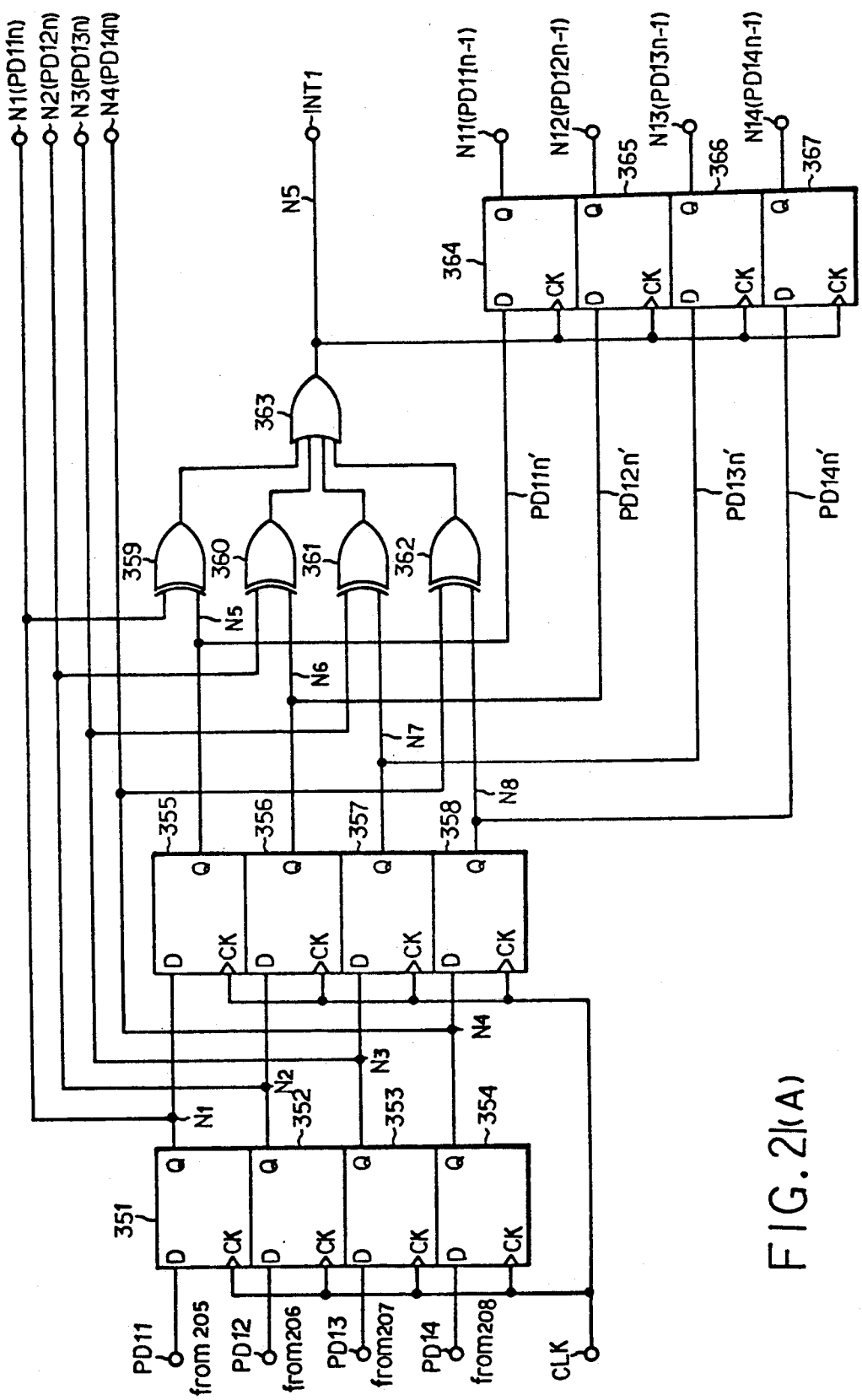
Figure 21B:
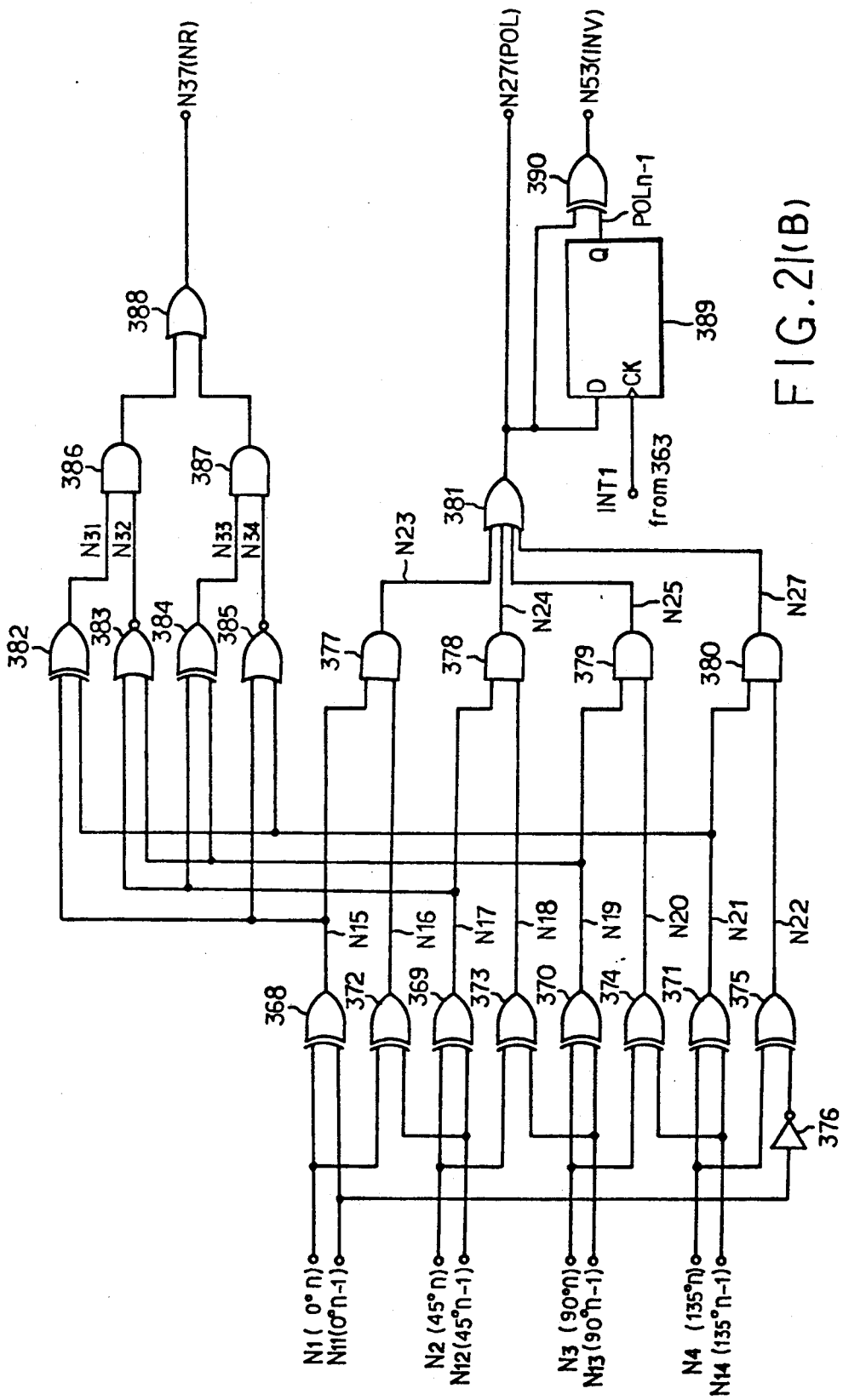
Figure 22:
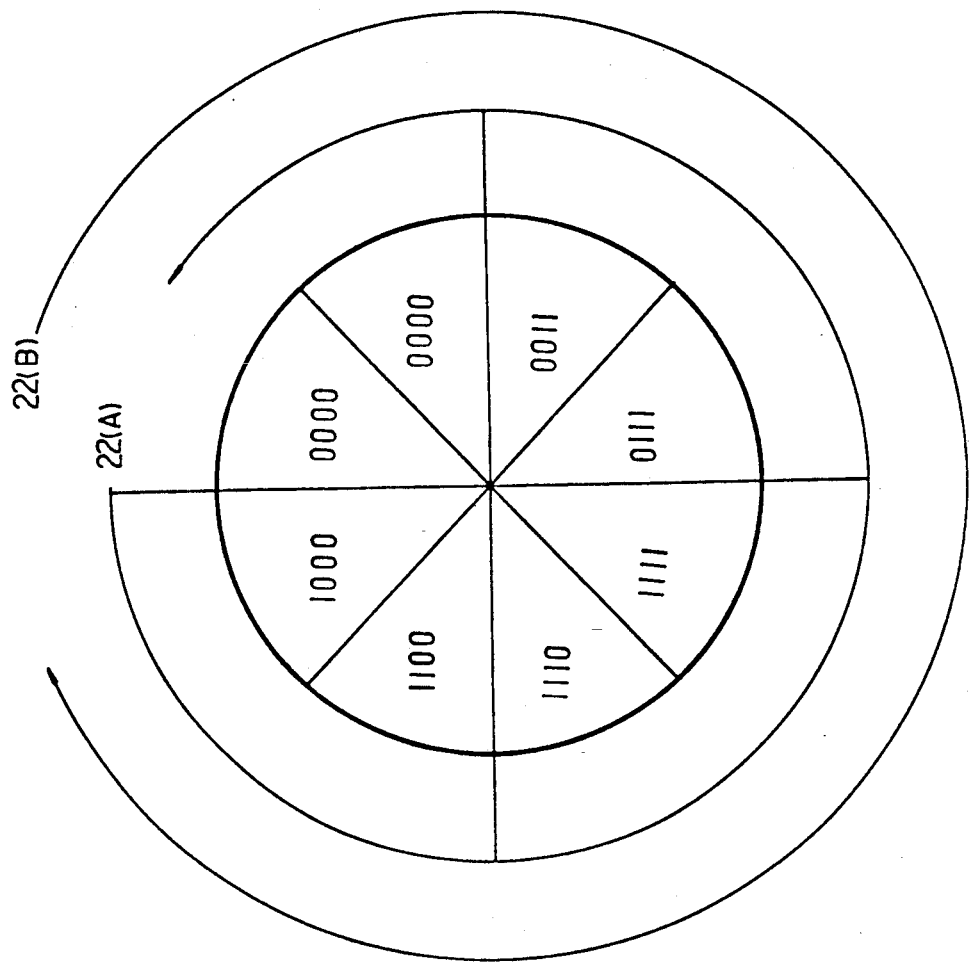

FIGS. 13(A) and 13(B) are flow chart of the demodulating operation according to the present invention;

FIG. 14 is a flow chart of interpolation demodulating in FIGS. 13(A) and 13(B);

FIG. 15 shows the form of the quantization information at a first interrupt signal INT1 generation;

FIG. 16 shows memory mapping of the first buffer and the second buffer;

FIG. 17 illustrates steps of the storing and processing information according to the first and second interrups;

FIGS. 18(A) and 18(B) are waveforms for illustrating the demodulation at every $\pi/2$ phase-digital conversion;

FIG. 19 is another example of the phase-digital converter 200 making every $\pi/4$ phase-digital conversion;

FIG. 20 illustrates the operational waveform of FIG. 19;

FIGS. 21(A) and 21(B) are another example of the interface 300 at every $\pi/4$ phase-digital conversion; and FIG. 22 illustrates the logical relationship at every $\pi/4$ phase-digital conversion.

DETAILED DESCRIPTION OF A PREFERRED EMBODIMENT

Figure 1:
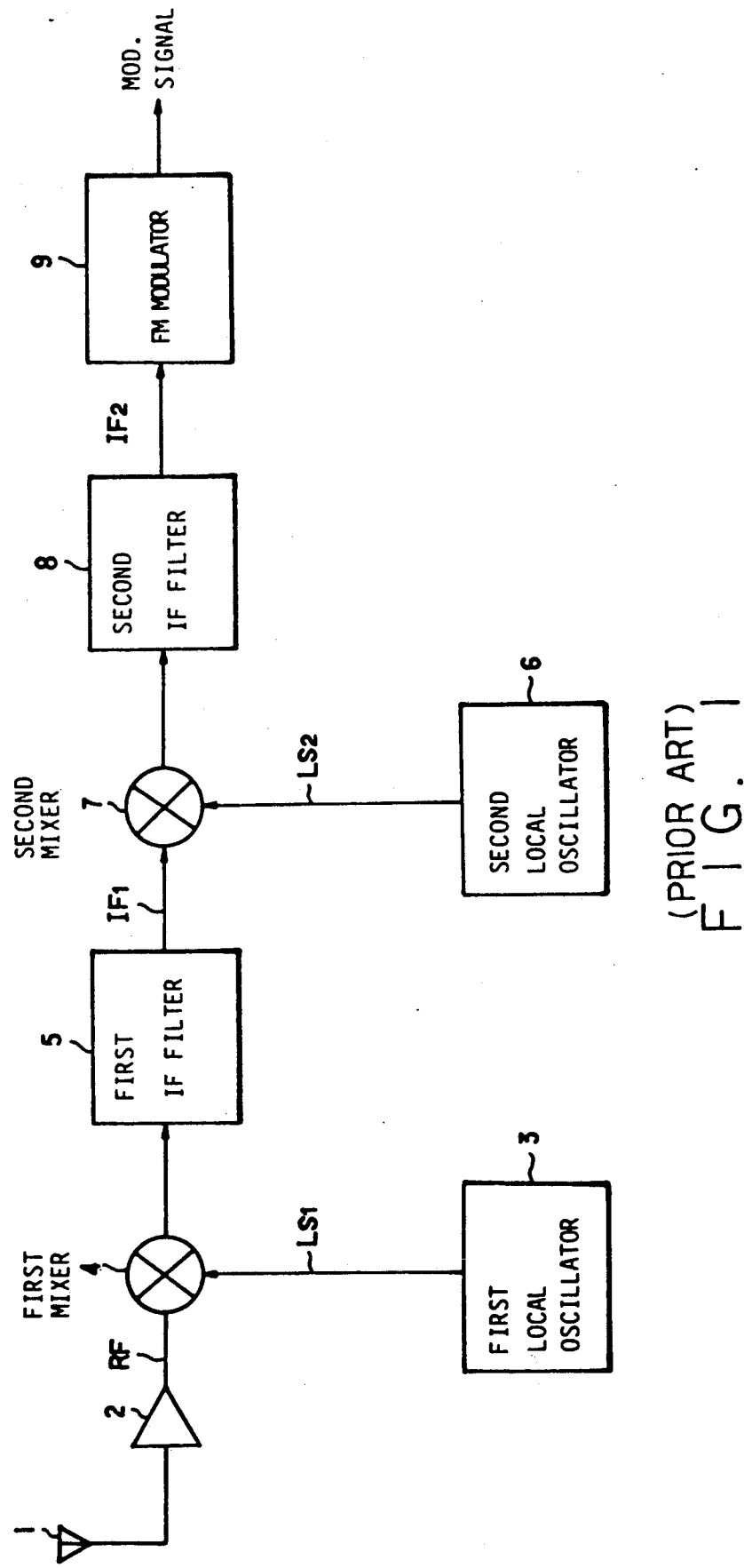
FIG. 1 is a conventional superheterodyne system for demodulating a frequency- and phase-modulated signal.
Figure 2:
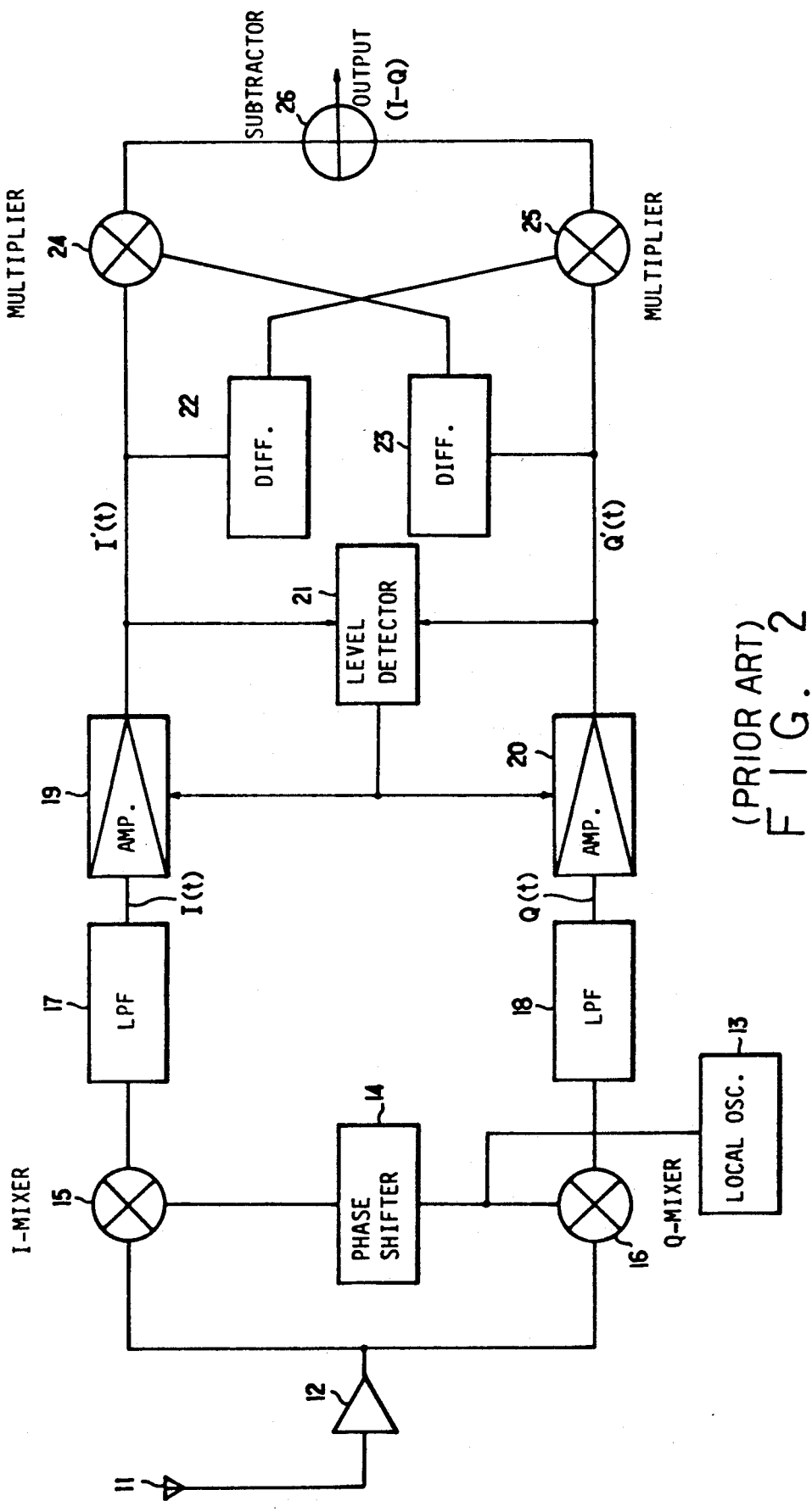
FIG. 2 is a conventional system for demodulating a frequency- or phase-modulated signal by using the quadrature phase.
Figure 3:
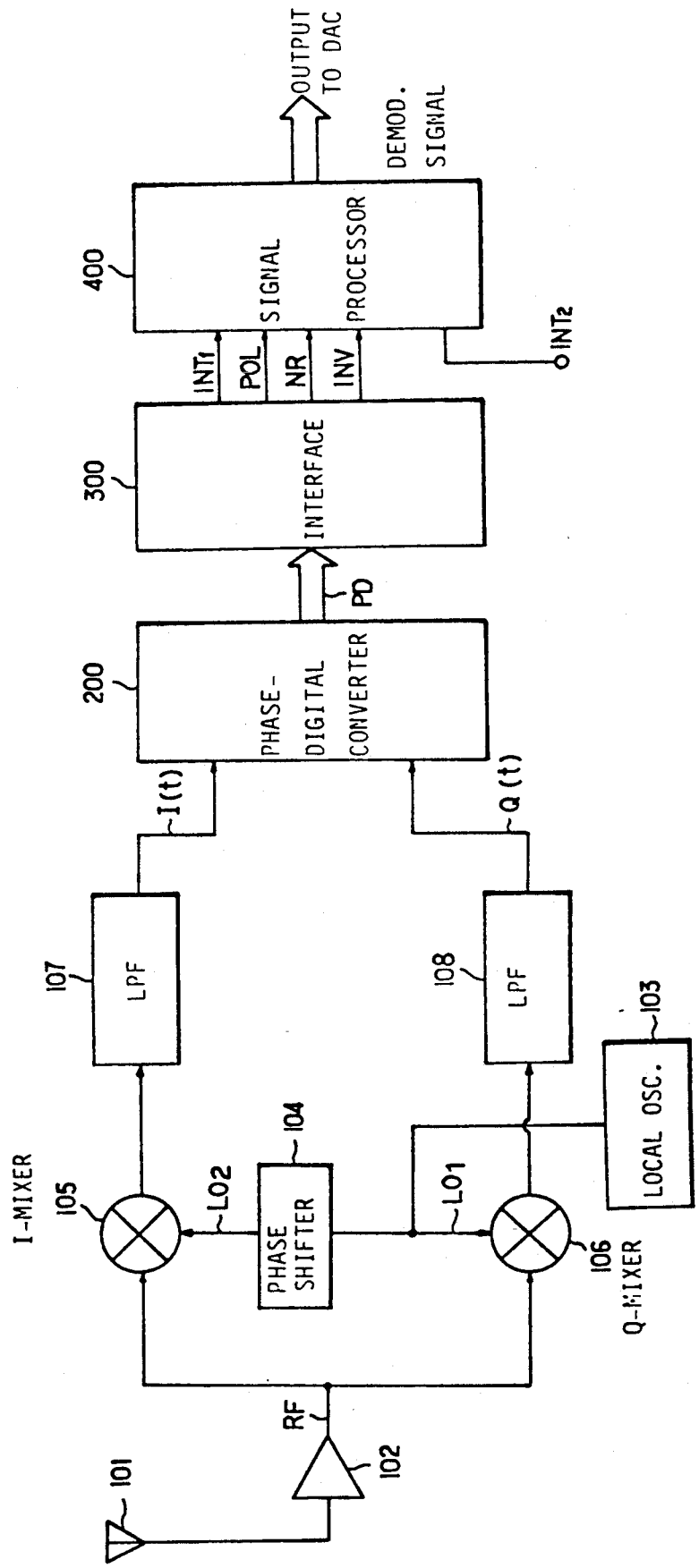
FIG. 3 is a system for digitally demodulating a frequency- or phase-modulated signal in accordance with the present invention.

FIG. 3 illustrates the demodulation system of the present invention. The system of the present invention includes an antenna 101 for receiving a frequency- or phase-modulated RF signal, a low-noise amplifier 102 coupled to the antenna for amplifying the received RF signal into a low-noise signal, a local oscillator 103 for generating first local oscillation frequency L01 identical with the carrier of the received RF signal, a phase shifter 104 for shifting by 90° the phase of the first local oscillation frequency L01 of the local oscillator 103 to produce second local oscillation frequency L02, an I-channel mixer 105 for mixing the received RF signal with the second local oscillation signal L02 of the phase shifter 104, a Q-channel mixer 106 for mixing the received RF signal with the first oscillation signal of the local oscillator 103, a first LPF 107 for filtering the output of the I-channel mixer 105 into a half of the channel bandwidth to generate a first analog signal I(t), a second LPF 108 for filtering the output of the Q-channel mixer 106 into a half of the channel bandwidth to produce a second analog signal Q(t), a phase-digital converter 200 for generating at least two phase-digital signals in order to quantize a fixed phase period of the first and second analog signals I(t), Q(t) outputted from the first and second LPF 107–108, an interface 300 coupled to the phase-digital converter, and a signal processor 400 coupled to the interface 300. The interface 300 generates the phase information comprising a first interrupt signal INT1 producing the quantization step signal by the phase-digital signal of the phase-digital converter 200 at the phase rotation, a first control signal POL (polarity) representing the rotation polarity to increase or decrease the quantization step, a second control signal NR (normal) representing whether or not the rotation step is normally increased or decreased, and a third control signal INV (inversion) for detecting the moment when the polarity of the phase rotation is changed. The signal processor 400 stores the phase information of the interface 300 and the quantization information obtained by counting the period of the first interrupt INT1, demodulates, by interpolating the instantaneous value of the present sampling with a basic modulated signal accumulated in the previous sampling period by a second interrupt INT2 generated at each fixed sampling period, accumulates information on each quantization of the present sampling period for the next sampling signal, and then compensates for the mean value of the direct current component of the modulated signal, thereby obtaining the present value of the direct current.

The inventive construction as described above will now be explained in more detail with reference to FIG. 3. If the RF signal is received through the antenna 101, it is amplified through the low noise amplifier 102, and applied to the I-channel and Q-channel mixers 105 and 106. The local oscillator 103 generates first local oscillation signal L01 having the same frequency as the carrier wave of the received RF signal. The phase shifter 104 generates the second local oscillation signal L02 having a phase difference of 90° with said first local oscillation frequency L01. Thus, the first local oscillation signal L01 and the second local oscillation signal L02 are in quadrature-phase with each other. The second local oscillation signal L02 is applied to the I-channel mixer 105, and the first local oscillation signal L01 is applied to the Q-channel mixer 106. The I channel mixer 105 mixes the received RF signal with the second local oscillation signal LO2 to produce the I-channel intermediate frequency processed by the first LPF 107. The LPF 107 filters this signal into a half of the channel bandwidth, and eliminates the harmonics components produced during the frequency modulation and the frequency adjacent to the image signal to produce the first analog signal I(t) given by the below equation (1). On the other hand, the Q-channel mixer 106 mixes the received RF signal with the first location oscillation signal LO1 to produce an output which is processed by the second LPF 108 as the first LPF 107 does, producing the second analog signal Q(t) given by the below equation (2).

$$I(t) = A \cos(W_o \cdot t + m(t)) \quad (1)$$

$$Q(t) = A \sin(W_o \cdot t + m(t)) \quad (2)$$

wherein
A = Amplitude,
Wo = Offset frequency between input local RF signals, and
m(t) = Modulated signal The I(t) and Q(t) signals given by the above equations (1) and (2) are inputted into the phase-digital converter 200 which converts digitally the two signals to use every fixed phase interval given by a below Equation (3) as the quantization period.

$$\text{Modulo } \pi/2^n \ (n=1,2,3,4,\ldots) \quad (3)$$

In Equation (3), if the phase variation period is $\pi/2$ (n=1), a zero-crossing of the I(t) and Q(t) is detected. If the phase-digital conversion is made at every $\pi/4$, the value n is selected to have the value of 2. If the phase-digital conversion is made at every $\pi/8$, the value n is selected to have the value of 3. Therefore, the period of the phase-digital conversion may be established as desired. The interface 300, which receives the phase-digital data of the phase-digital converter 200, produces the variable phase information of the first interrupt INT1, and the first, second and third control signals POL,NR,INV which are used for demodulating the RF signal in the signal processor 400.

Firstly, the first interrupt signal INT1 is the reference signal of the quantization step for demodulation, being produced when the modulo $\pi/2^n$ (n=1,2,3,4 . . . ) of the equation (3) is changed at phase rotation. Secondly, the first control signal POL represents the relative phase variation of Equations (1) and (2), distinguishing whether the polarity of the relative phase of the I(t) signal and Q(t) signal is negative or positive to increase or decrease the quantization step in demodulation. Thirdly, the second control signal NR represents whether the phase rotation changes normally by one step toward the negative or positive direction, in which it is regarded as abnormal when the position to be demodulated is in the same step as the preceding state or moved further than two steps, at generation of the first interrupt INT1. Fourthly, the third control signal INV represents the moment when the polarity of the phase rotation is changed, generated when the phase of the modulated signal is inverted.

The signal processor 400 accumulates the variable phase information produced from the interface 300 at every moment of modulo $\pi/2^n$ phase variation, digitally demodulating the signal at each period of the second interrupt INT2 produced as the sampling signal at every fixed period. Namely, according to the first interrupt INT1 generated at the moment of the modulo $\pi/2^n$ phase variation of the I-channel and Q-channel, the signal processor 400 stores the counted values of the periods of the first to third control signals POL,NR,INV and the first interrupt INT1 produced as the variable phase information from the interface 300, and demodulates the basic demodulated signal accumulated during the sampling period of the preceding state by interpolating the instantaneous value of the present sampling at generation of the second interrupt signal INT2. Here, the interpolation means that when the second interrupt INT2 is generated between any two first interrupts INT1, the quantization steps of the preceding sampling periods are added or subtracted to or from each other to obtain the instantaneous value of the second interrupt INT2 at its moment of generation, this will be further described in following description.

After demodulating according to the sampling period of the preceding state, the signal processor 400 accumulates the variable phase information in one sampling period to perform interpolation at the next sampling signal, compensating for the average direct current component of the demodulated signal produced by the frequency deviation between the two RF signals.

In the demodulation system of the present invention as described above, there is a phase difference of 90° between the I-channel and Q-channel unlike the superheterodyne method, and it digitally demodulates the signal by digitally converting the phase of the intermediate frequency (IF) signal of quadrature-phase obtained by two local oscillation signals having the same frequency as the received RF frequency. Further, since the two signals of quadrature-phase may be converted into the digital signals of a desired fixed phase interval, it is possible to set a desired quantization step in modulation. On the other hand, since there are $COS(X) = COS(-X)$ and $SIN(X) = -SIN(-X)$ in the relative phase of the I-channel and Q-channel, which means the phase inversion of one signal for negative phase, the original signal is reproduced by adding or subtracting a constant digital value depending on the phase relationship of the two signals at each phase-digital conversion. Consequently, the quantization step becomes a fixed phase period of the I(t) and the Q(t). Furthermore, because the number of the phase-digital signals per unit time is inversely proportional to the frequency of modulated signal for the same bandwidth modulation, the De-emphasis characteristic needed for most radio receivers is inherently obtained.

Figure 5:
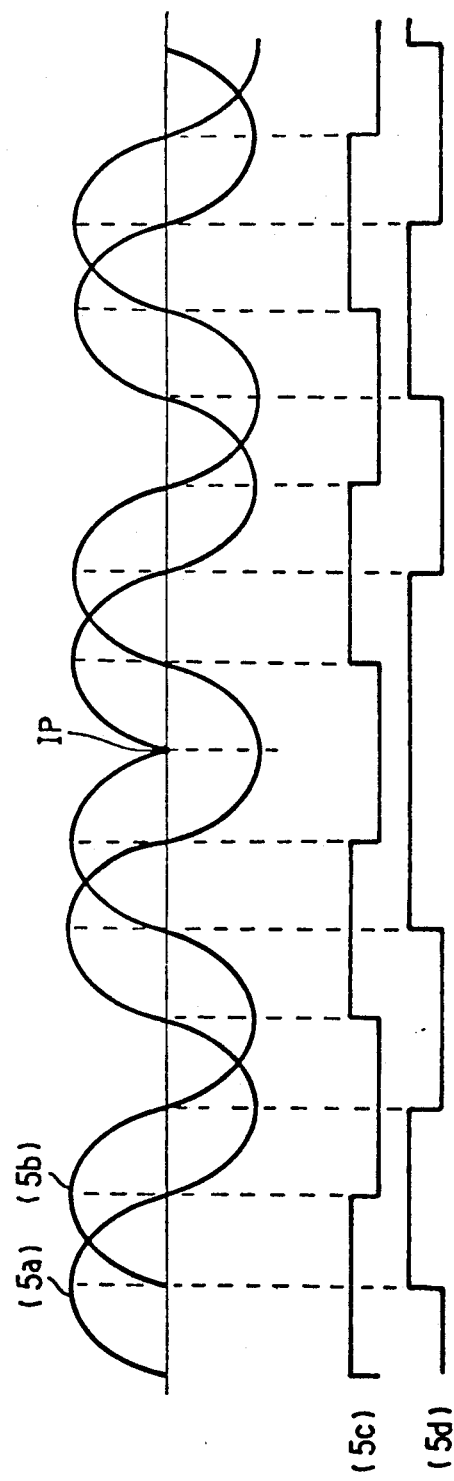
FIG. 5 is the operational waveform of FIG. 4.

Hereinafter, with reference to a specific embodiment of the present invention the above matters are detailedly explained. FIG. 4 illustrates an embodiment of every $\pi/2$ phase-digital conversion obtained by the phase-digital converter 200 of FIG. 3. FIG. 5 shows the operating waveforms of FIG. 4, where because the I(t) or Q(t) (as shown by 5a and 5b) becomes zero at every $\pi$ interval, the inverting terminals (−) of the comparators 201 and 202 are grounded in order to detect the zero-crossing of the I(t) and Q(t) channel signals. The I(t) and Q(t) are respectively connected with the non-inverting terminals (+) of the comparators 201 and 202, so that the comparator 201 outputs first phase-digital signal PD1 as shown by 5c, and the comparator 202 second phase-digital signal as shown by 5d.

FIG. 6 illustrates an embodiment of the interface 300 receiving the output of the phase-digital converter 200.

The interface 300 comprises:

flip-flops 301 and 302 for synchronizing with clock 205 the signals PD1 and PD2 obtained by converting digitally every $\pi/2$ phase variation to produce the signals PD1n and PD2n;

flip-flops 303 and 304 for generating the signals PD1n' and PD2n' obtained by delaying the outputs of the flip-flops 301 and 302 by a single clock pulse to produce the first interrupt signal at every $\pi/2$ phase variation;

gate 305 for exclusive-OR-operating the outputs of the flip-flops 301 and 303 to detect $\pi$-phase variation signal of the I-channel;

gate 306 for exclusive-OR-operating the outputs of the flip-flops 302 and 304 to detect the $\pi$-phase variation signal of the Q-channel;

first section comprising gate 307 for detecting every $\pi/2$ phase variation signal produced by the quadrature phase of the I-channel and Q-channel through logically adding the outputs of the gates 305-306;

flip-flop 308 for synchronizing the signal PD2n' of the flip-flop 304 with the first interrupt signal INT1 to produce the signal PD2n−1 preceding the signal PD2n;

second section comprising gate 309 for exclusive-OR-operating the outputs PD1n and PD2n−1 of the flip-flops 301 and 308;

flip-flop 310 for synchronizing the output PD1n' of the flip-flop 303 with the output of the gate 307 to produce signal PD1n−1 preceding the signal PD1n;

gate 311 for exclusive-OR-operating the outputs of the flip-flops 310 and 302;

third section comprising gate 312 for exclusive-OR-operating the outputs of the gates 311 and 309;

flip-flop 313 for synchronizing the second control signal POL of the gate 307 with the output of the gate 309 by the interrupt signal INT1 to produce the preceding second control signal POLn−1; and fourth section for exclusive-OR-operating the output of the flip-flop 313 and the second control signal POL of the gate 309.

Thus, the first section detects every $\pi/2$ phase variation moment of the I- and Q-channels to generate the first interrupt signal INT1 representing the quantization step. The second section generates the first control signal POL representing the increasing or decreasing polarity of the quantization step according to the phase variation signals PD1 and PD2 of the I-channel and Q-channel. The third section generates the second control signal NR representing the normal or abnormal state of the phase variation signals PD1, PD2. The fourth section generates the third control signal INV for maintaining the preceding state without adding or subtracting the quantization step when the phase relationship of the I(t) and Q(t) changes.

Figure 7:
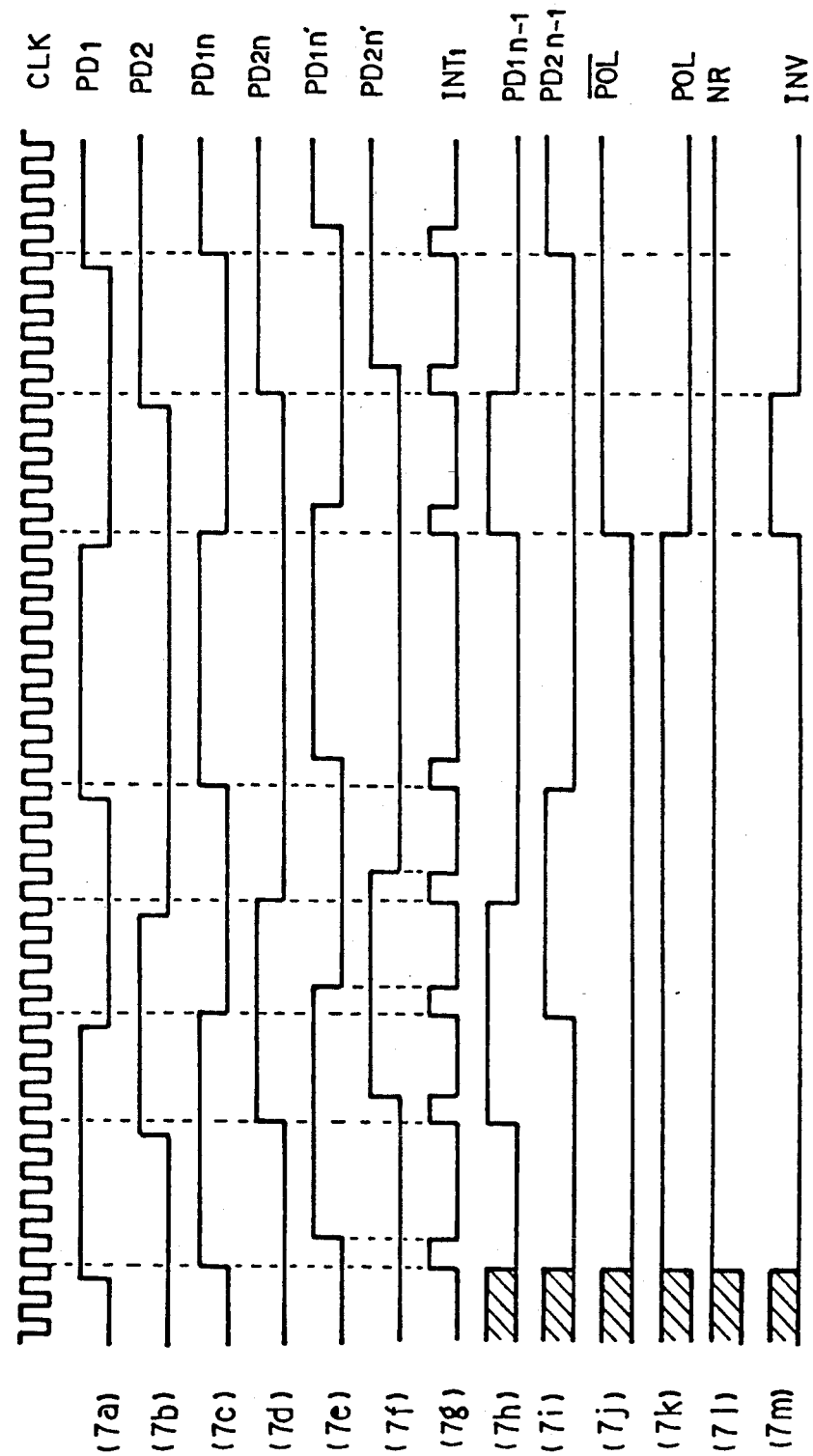
FIG. 7 is the operational waveform of each part of FIG. 6.
Figure 8:
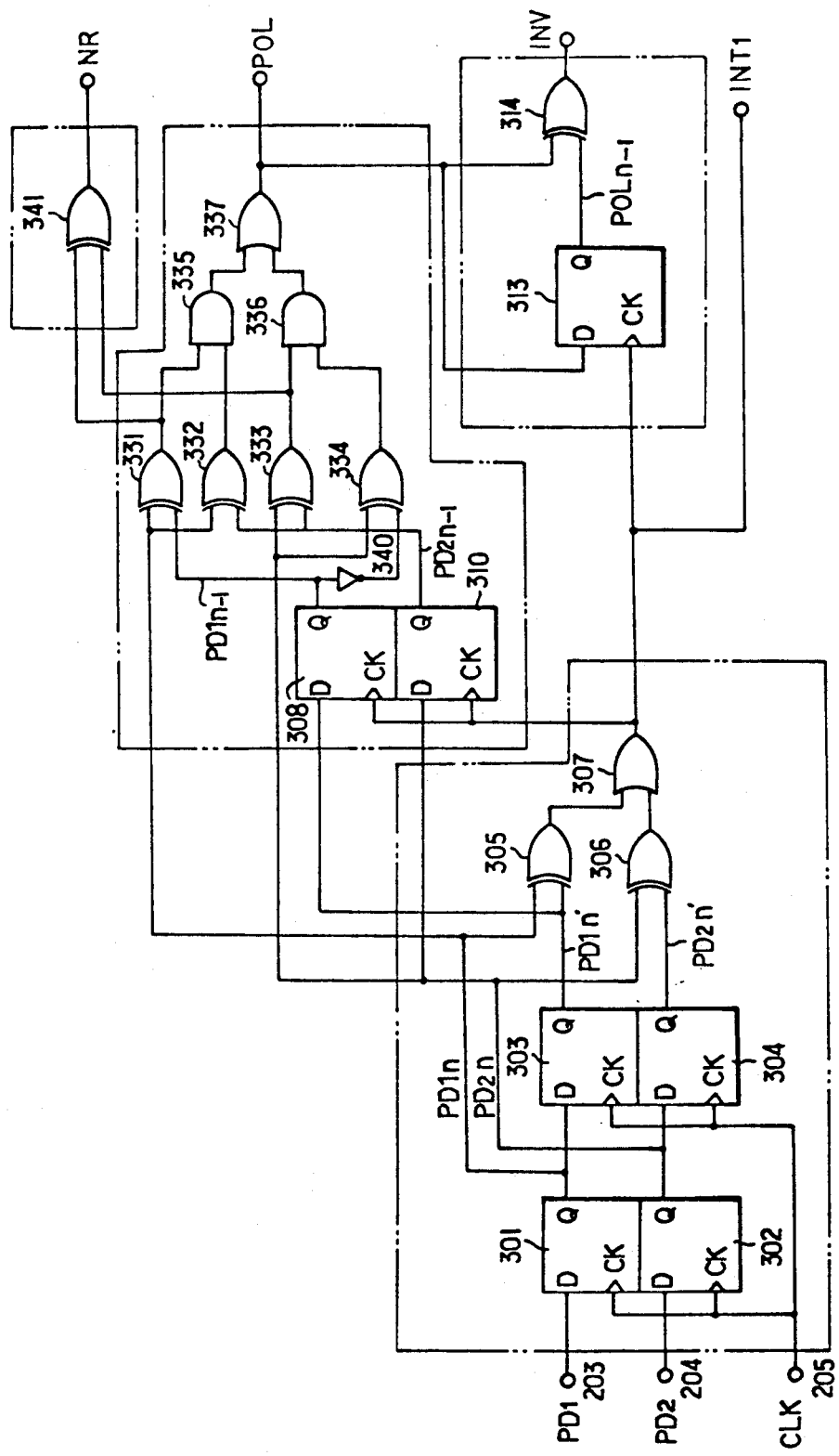
FIG. 8 is another example of the interface 300 for producing the quantization information at every $\pi/2$ phase period in FIG. 3.

FIG. 7 illustrates the waveforms of FIG. 6. FIG. 8 is another embodiment of the interface 300 as shown in FIG. 4. The construction of the first and fourth sections except for the second and third sections is the same as FIG. 5 with the same reference numerals used to indicate the corresponding parts.

This embodiment contains:

gate 331 for exclusive-OR-operating the present signal PD1 (PD1n) and the preceding signal PD1-1 (PD1n−1) synchronized with the clock 205;

gate 332 for exclusive-OR-operating the present signal PD1n and the preceding signal PD2n−1;

gate 335 for logically multiplying the outputs of the gates 331-332 to represent the present phase-advancing direction according to the preceding phase at the moment of m$\pi$ (m=0,1,2,...) phase variation;

gate 333 for exclusive-OR-operating the present signal PD2n and the preceding signal PD2n−1;

gate 334 for exclusive-OR-operating the present signal PD2n and the preceding PD1 signal PD1n−1 through the inverter 340;

gate 336 for multiplying logically the outputs of the exclusive-OR gates 333-334 to represent the present phase moving direction according to the preceding phase at the moment of (m+1)$\pi/2$ (m=0,1,2,3,...);

second section comprising a gate 337 for logically adding the outputs of the gates 335-336 to represent the directional polarity of the phase moving at every moment of $\pi/2$ phase variation; and third section comprising a gate 341 for exclusive-OR-operating the outputs of the exclusive-OR gates 331,333 to generate signals representing abnormal state when the two inputs of the gates are equal with each other, namely, the phase variation is the same step when it proceeds by two steps, or normal state when the phase variation proceeds by one step.

Figure 9:
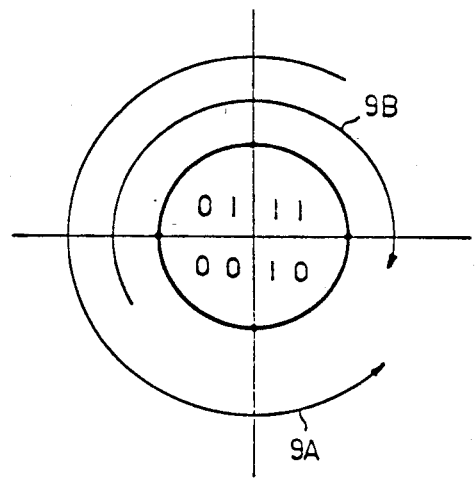
FIG. 9 illustrates a logical relationship of the phase-digital signals of first and second analog signals at every $\pi/2$ phase-digital conversion.
Figure 10:
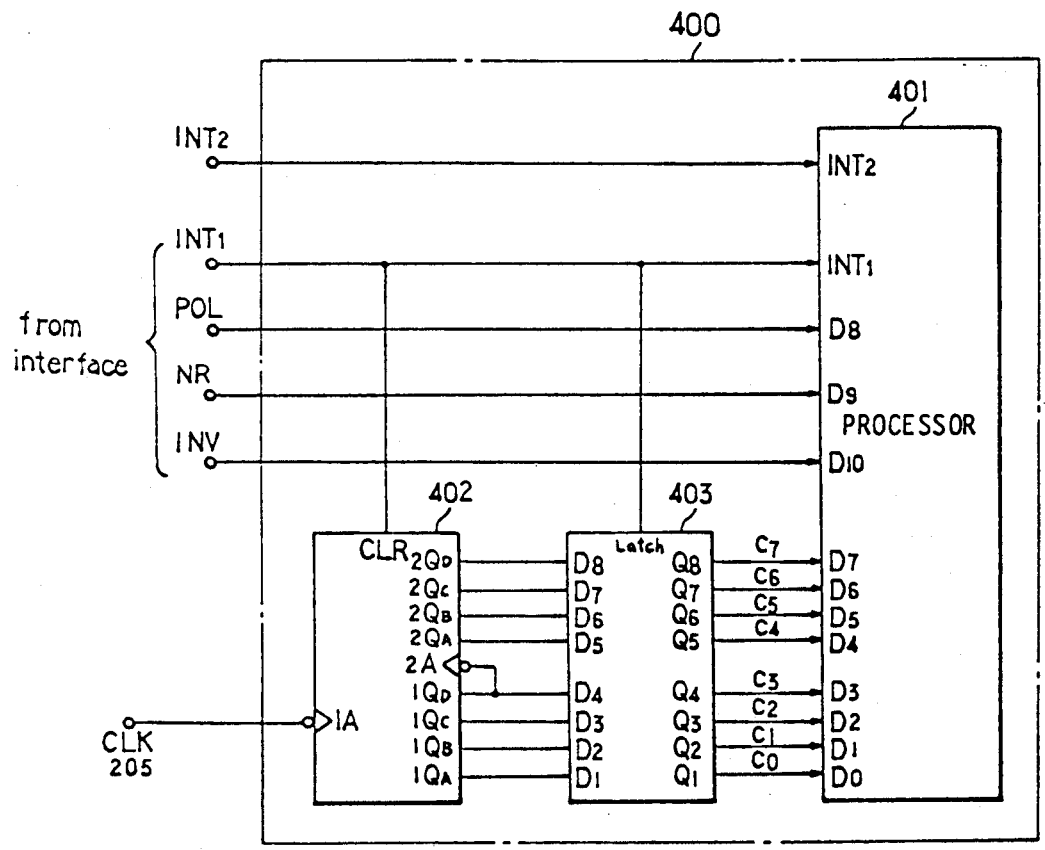
FIG. 10 is a circuit diagram of a signal processor 400 in FIG. 3.

FIG. 9 illustrates the logic change according to a particular phase relationship, whereby the signals PD1 and PD2 are undergoing every $\pi/2$ phase variation, the logic change of the positive phase relation 9A proceeds in the sequence of 01→00→10→11→01, whereas the logic change of the negative phase relation 9B proceeds in the sequence of 01→11→10→00→01.

the signal processor 400 as shown in FIG. 10 includes:

processor 401 for storing the phase variation information of the first to third control signals POL, NR, INV and the self-step counting value by the first interrupt INT1 of the interface 300 to digitally demodulate by interpolation in the period of the second interrupt INT2 according to the pertinent information;

counter 402 for generating the self-step counting value during the pertinent quantization period of the first interrupt INT1, the counter being cleared by the first interrupt INT1 of the interface; and latch 403 for outputting the output of the counter 402 to the processor 401 by the first interrupt.

Figure 11:
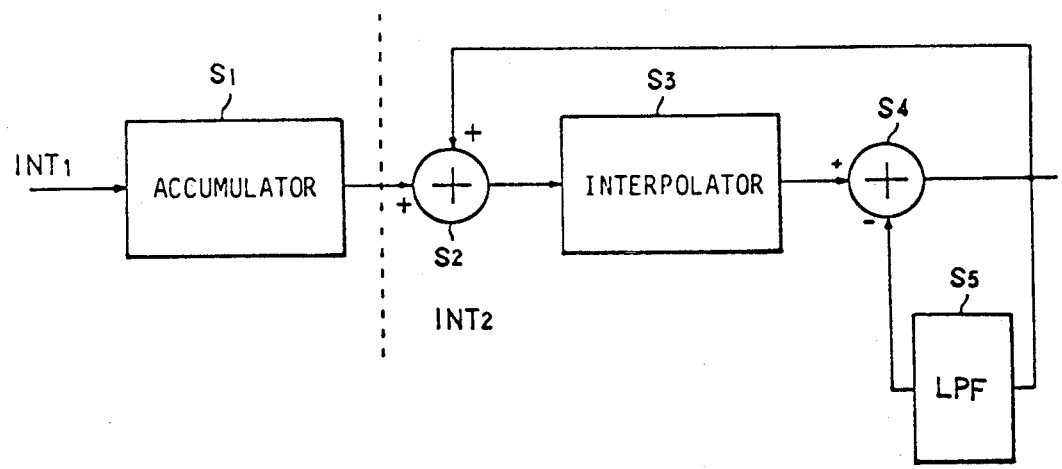
FIG. 11 is a flow chart of the signal control sequence according to the present invention.

FIG. 11 is a flow chard according to the control sequence of the signal processor 400 in demodulation. The steps of the signal processing is as follows:

STEP S1: During the period of the second interrupt signal INT2 of a fixed sampling period, the variable phase information is inputted for every first interrupt INT1 produced at the moment of modulo $\pi/2n$ (n=1,2,3,4,...) phase variation, and is sequentially accumulated (adding or subtracting the present quantization step according to the preceding information) according to the contents.

STEP S2: The second interrupt INT2 signalling, the output value is added to the above accumulated value.

STEP S3: The signal is demodulated by interpolation.

STEP S4: The present demodulated signal is compensated with the direct current component of the demodulated signal obtained during the proceeding sampling period.

STEP S5: The direct current component of the signal demodulated by the frequency deviation of the present output is detected to prepare for the demodulated signal of the next sampling period.

the actual processing flow of the signal processor 400 proceeds in the sequence of S2→S3→S4→S1→S5.

Figure 12:
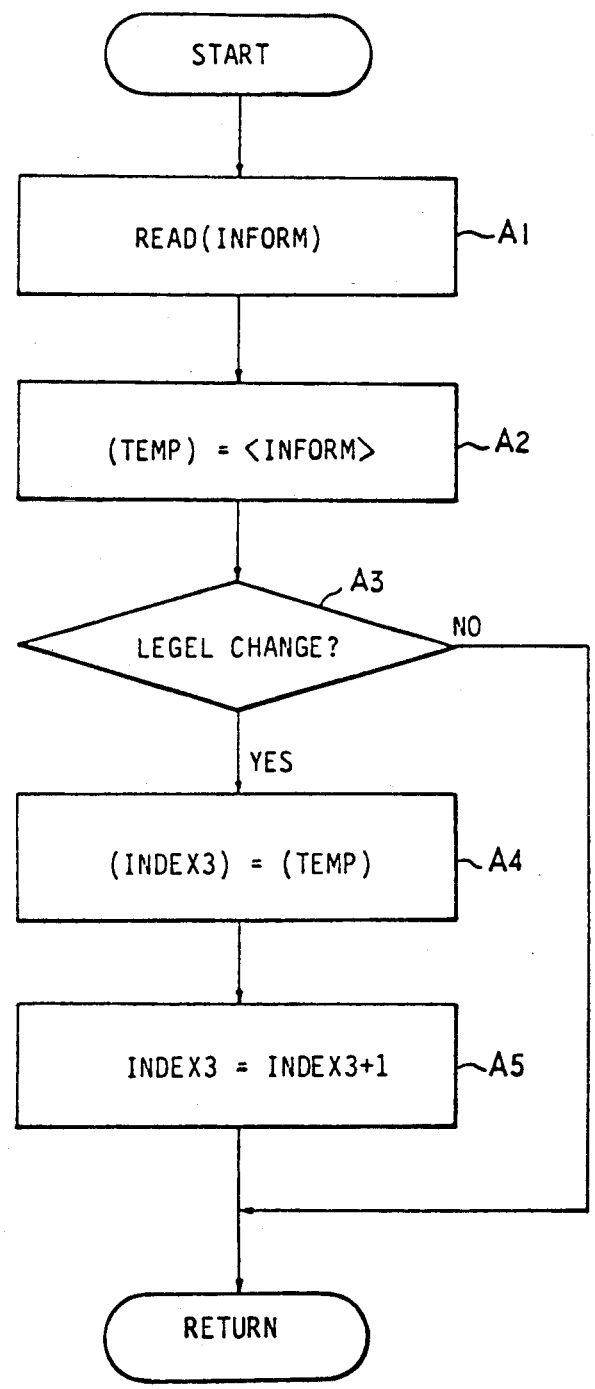
FIG. 12 is a flow chart of storing the quantization information according to the invention.

FIG. 12 is a flow chart for storing the variable phase information when the first interrupt INT1, as the input of step S1 in FIG. 11, is generated in demodulation.

FIGS. 13(A) and 13(B) are flow chart, as shown by the steps S1-S5 of FIG. 11, for illustrating the demodulation of the pertinent sampling period when the second interrupt INT2 is generated.

FIG. 14 is the subrouting of demodulating by interpolation in FIGS. 13(A) and 13(B).

FIG. 15 shows a scheme of the variable phase information inputted into the processor 401 when the first interrupt INT1 is generated. The information comprises 10 bit data consisting of 8 bits of the quantization period values CV and the first to third control signals POL, NR, INV.

FIG. 16 is memory mapping of the first buffer and the second buffer. The first buffer (active buffer) stores the variable phase information as shown in FIG. 15 when the first interrupt INT1 is generated. The second buffer (interpolation buffer) demodulates the modulated signal by means of the variable phase information stored during the period of the preceding state when the second interrupt INT2 is generated. Whenever the second interrupt signal INT2 is generated, the functions of the two buffers are interchanged.

FIG. 17 illustrates the functions of the first and second buffers by the first and second interrupts INT-1,INT2. 17A is the first interrupt INT1 indicating the generation of the quantization step, 17B the second interrupt INT2 for the sampling signal, 17C the address of the first buffer (active buffer), 17D the address of the second buffer (interpolation buffer), and CV the quantization period.

FIG. 18(A)(B) are waveform for illustrating demodulation of the RF which is phase modulated at every $\pi/2$ phase-digital conversion. A reference numeral Fa in FIG. 18(A) shows a frequency-modulated waveform, and Pa a phase-modulated waveform. Here, the modulated signal according to an embodiment of the present invention is 1 KHZ, assumed to have been frequency-modulated or phase-modulated ideally as shown in 18(A). The sampling frequency of the second interrupt INT2 is assumed to be 8 KHZ.

FIG. 19 is a second embodiment of the phase-digital converter 200 for every $\pi/4$ phase-digital conversion, and FIG. 20 illustrates the waveforms of the parts of FIG. 19.

The signal I(t) as shown in FIG. 20a is connected with the non-inverting terminals of the comparators 205-206 and the inverting terminal of the comparator 208, while the signal Q(t) as shown in FIG. 20b is connected with the non-inverting terminals of the comparators 207-208 and the inverting terminal of the comparator 206 via the inverter 209. The inverting terminals of the comparators 205-207 are grounded. Then, the comparator 205 generates PD11 of every $m\pi$ (m=0,1,2,...) change, the comparator 206 generates PD12 of every $(m+1)\pi/4$ (m=0,1,2,...) change, the comparator 207 generates PD13 of every $(m+2)\pi/4$ (m=1,2,3,...) change, and the comparator 208 generates PD14 of every $(m+3)\pi/4$ (m=1,2,3,...) change.

FIG. 21 is another embodiment of the interface 300, if the phase-digital converter 200 is constructed as shown in FIG. 19. The interface comprises:

flip-flops for synchronizing with the clock 205 every $\pi/4$ phase change signal PD11-PD14 of the demodulated signal through the comparators 205-208;

flip-flops 355-358 for delaying the outputs of the flip-flops 351-354 by one clock pulse by the clock 205;

gates 359-362 for exclusive-OR-operating the outputs of the flip-flops 351-354 and 355-358 to generate the first interrupt INT1 at every phase change;

first section having a gate 363 for logically adding the outputs of the gates 359-362 to generate the first interrupt INT1 indicating the quantization step at every $\pi/4$ phase change PD11-PD14;

second section having the gates 368-375 for receiving the present signals PD11n-PD14n of the flip-flops 351-354 at one input terminal and the preceding signals PD11n-1-PD14n-1 of the flip-flops 364-367 at the other input terminal, first gates 368-371 exclusive-OR-operating the present self phase and the preceding self phase, second gates 372-375 exclusive-OR-operating the present self phase and the preceding next phase, gate 377 for logically multiplying the outputs of the gates 368, 372 to generate the first control signal POL at PD1 phase change, gate 378 for logically multiplying the outputs of the gates 369, 373 to generate the first control signal POL at PD2 phase change, gate 379 for logically multiplying the outputs of the gates 370, 374 to generate the first control signal POL at PD3 phase change, gate 380 for logically multiplying the outputs of the gates 371, 375 to generate the first control signal POL at PD4 phase change, and gate 381 for logically adding the outputs of the gates 377-380 to generate the first control signal POL representing the increase or decrease of the quantization step by the first interrupt INT1 at every $\pi/4$ phase change;

third section having exclusive-OR-gate 382 for operating the outputs of the gates 368, 371 detecting the proceeding state of the preceding and present first phase PD11 and fourth phase PD14, gate 383 for NOR-operating the outputs of the gates 369, 370 detecting second phase PD12 and third phase PD13, gate 386 for logically multiplying the outputs of the gates 382, 383 to generate a signal indicating whether the moving steps of the first phase PD11 and fourth phase PD14 are normal, gate 384 for exclusive-OR-operating the outputs of the gates 369, 370, gate 385 for NOR-operating the outputs of the gates 368, 371, gate 387 for logically adding the outputs of the gates 384, 385 to generate a signal indicating whether the moving steps of the second phase PD12 and the third phase PD13 are normal, and gate 388 for logically adding the outputs of the gates 386, 387 to generate the second control signal NR indicating whether the quantization step is normally increased or decreased by one step at every $\pi/4$ phase change; and fourth section having a flip-flop for synchronizing the output of the second section with the output of the first section to generate the first control signal of the preceding state, and gate 390 for exclusive-OR-operating the outputs of the flip-flop 389 and the second section, thereby generating the quantization compensating signal according to inversion of the phase moving direction when the first control signal POL of the preceding state differs from that of the present state.

Demodulation according to the present invention of a frequency- or phase-modulated signal will be explained with reference to the attached drawings hereinafter. Through the antenna 101 a frequency- or phase-modulated signal as shown by Fa or Pa in FIG. 18 is received. The received RF signal is low-noise-amplified through the low noise amplifier 102, and applied to the I mixer 105 and Q mixer 106. Here, it is assumed that the presently received RF signal is phase-modulated, and the degree of the phase modulation is 1(Kp=1).

the local oscillation frequency produced from the local oscillator 103 is the same as that of the carrier of the received RF. The local oscillation signal is made to produce two local oscillation signals having the phase difference of 90° with each other by using the phase shifter 104. Hence, the I mixer mixes the received RF signal and the local oscillation signal LO2 through the phase shifter 104. The output of the I-channel mixer 105 is filtered to have a bandwidth half of the channel band through the first LPF 107 whose output is as shown in FIG. 18A-c. The Q mixer mixes the received RF signal and the local oscillation signal LO1 of the local oscillator 103. The output of the Q-channel mixer is filtered to have a bandwidth of half the channel band through the second LPF 18 whose output is as shown in FIG. 18A-b.

Firstly, the demodulation by every $\pi/2$ phase-digital converter is explained. Since the I(t), as shown by Eq.(1), is a cosine wave, it becomes zero if $[W0 \cdot t + m(t)]$ is $(n+1)\pi/2$ $(n=0,1,2,3,\ldots)$. On the other hand, since the Q(t) is a sine wave, it becomes zero if $[W0 \cdot t + m(t)]$ is $n\pi/2$ $(n=0,1,2,3,\ldots)$. Hence, because the I(t) as shown by 5a or the Q(t) as shown by 5b crosses the zero point at every $\pi$ phase change, if the inverting terminals of the comparators 201-202 are grounded, and the Q(t) and I(t) are applied respectively to the non-inverting terminals of the comparators 202 and 201, the signals PD1 and PD2 are obtained by digitally converting the phase as shown by 5c and 5d (see FIGS. 18A-d and 18A-e). Namely, since n+1 for module $n\pi/2$ $(\pi/2, 2\pi/2, 3\pi/2, 4\pi/2\ldots)$, the $\pi$ phase change signal of each signal is detected in the I channel and Q channel, and the $\pi/2$ phase change period is set as the quantization step.

The interface 300 generates the variable phase information toward the signal processor 400 at every step change. If each $\pi/2$ phase period is converted digitally, the interface is constructed as shown in FIGS. 6 and 8. If the two signals PD1 and PD2 produced at every $\pi/2$ phase change of the I channel and Q channel, as shown by 7a and 7b, are applied, respectively, to the data input terminals of the flip-flops 301 and 302, they are synchronized with the clock 205, produced as shown by 7c and 7d. The I channel signal PD1n through the flip-flop 301, as shown by 7c, is applied to the data input terminal of the flip-flop 303, synchronized with the clock CLK to produce the output PD1n' after delaying of one clock pulse, as shown by 7e. Thus, the I channel signal of the PD1n and PD1n' line 323 is delayed by one clock pulse through the flip-flop 303. The gate 305 for exclusive-OR-operating the I channel signal detects each $\pi$ phase change produced from the I channel. Likewise, the Q channel signal of PD2n is delayed by one clock pulse through the flip-flop 304. The gate 306 for exclusive-OR-operating the two signals detects the $\pi$ phase change produced from the Q channel. In this case, the gate 307 logically adds the phase change signals of the I channel and Q channel produced from the two gates 305 and 306 to detect every $\pi/2$ phase change signal, as shown by 7g, produced from the two channels, and applies it as the first interrupt INT1 to the signal processor 400 in order to indicate the generation of the quantization step. (see FIG. 18A-f).

Detecting the phase relationship of the two signals of the I-channel and the Q-channel, if $[W0 \cdot t + m(t)]$ has a positive value, the I(t) and the Q(t), as shown by 5a and 5b, all have a positive phase value, while if $[W0 \cdot t + m(t)]$ has a negative value, the I(t) has a positive phase value, and the Q(t) has a negative phase value. This means the Q(t) has changed its phase by 180° $(\pi)$. The phase relationship of the two signals may be perceived by the logic level of the phase-digital converted signal as shown by 5c and 5d. The two signals are simultaneously detected to determine the direction of every $\pi/2$ signal change. The logic value of the phase-digital converted signal shown by 5c and 5d is represented by the relation of FIG. 9. Namely, as shown in FIG. 9, the positive phase relationship is characterized by the logic value of the I-channel and the Q-channel being repeated in the sequence of 11→01→00→10→11, while the negative phase relationship as shown by 9(B) is characterized by the logic value of the two channels being repeated in the sequence of 10→00→01→11→10. Also, when the phase moves from the present direction into the next direction, the positive phase relationship is as shown in Table 1.

TABLE 1

| PD1n-1 | PD2n-1 | | PD1n | PD2n |
|---|---|---|---|---|
| 1 | 1 | → | 0 | 1 |
| 0 | 1 | → | 0 | 0 |
| 0 | 0 | → | 1 | 0 |
| 1 | 0 | → | 1 | 1 |

The negative phase relationship is as shown in Table 2.

TABLE 2

| PD1n-1 | PD2n-1 | | PD1n | PD2n |
|---|---|---|---|---|
| 1 | 0 | → | 0 | 0 |
| 0 | 0 | → | 0 | 1 |
| 0 | 1 | → | 1 | 1 |
| 1 | 1 | → | 1 | 0 |

Here, PD1n−1 is the preceding output obtained by delaying the signal PD1n of the I channel by a period of the first interrupt INT1 through the flip-flop 310, and PD2n−1 the preceding output obtained by delaying the signal PD2n of the Q channel by a period of the first interrupt INT1 through the flip-flop 308. PD1 and PD2 are the phase-digital converted signals of the I(t) and the Q(t). Hence, the signals PD1n and PD2n are the present values, while the signals PD1n−1 and PD2n−1 are the values of the state preceding before the present state by a period of the first interrupt INT1. In the positive phase relationship of Table 1, PD1n−1 and PD2n have the same value, while PD2n−1 and PD1n have the opposite value. In the negative phase relationship of Table 2, PD2n−1 and PD1n have the same value, while PD1n−1 and PD2n have the opposite value.

Hence, the phase relationship is as shown in Table 3.

TABLE 3

| Positive phase relationship | Negative phase relationship |
|---|---|
| PD1n-1 ⊕ PD2n = 0 | PD1n-1 ⊕ PD2n = 1 |
| PD2n-1 ⊕ PD1n = 0 | PD2n-1 ⊕ PD1n = 1 |

In order to detect the phase relationship of the I channel and the Q channel, the signals PD1n' and PD2n' delayed by one clock pulse are applied respectively to the flip-flops 308 and 310, synchronized with the first interrupt INT1 to produce the signals delayed by a period of the first interrupt INT1, as shown by 7h and 7i. This is to confirm the phase relationship of the preceding state when the signal processor 400 demodulates the modulated signal. The gate 309 exclusive-OR-operates the signals PD2n−1 and PD1n' to generate a signal of the positive or negative phase relationship as the polarity signal of the quantization step according to the phase relationship, where logic 1(high) represents the positive phase relationship, and logic 0(low) the negative phase relationship. The logic signal produced according to the phase relationship becomes the first control signal POL.

When the normality or abnormality of the quantization step is detected after generation of the first control signal POL, the increase or decrease by one step indicates the normal state. If the signals of 7j and 7k become 00 or 11 by a noise or other influence, the state is abnormal. Hence, the signal PD1n−1 as shown by 7h and the signal PD2n as shown by 7d are exclusive-OR-operated by the gate 311 to produce a signal, which is again exclusive-OR-operated with the first control signal POL by the gate 312 to produce the second control signal NR as shown by 7l. Namely, the second control signal NR is known by the operation of $(PD1n-1 \oplus PD2n) \oplus (PD2n-1 \oplus PD1n)$. When the result of the operation exceeds two steps (logic 11) or maintains the same step (logic 00) at generation of an interrupt, the state is abnormal. On the other hand, if the output of the exclusive-OR-gate 312 is logic 1(high), the state is normal, while if the output is logic 0, the state is abnormal. The state moves in the positive or negative phase relationship at the normal change (the second control signal NR is 1). When the second interrupt INT2 of the sampling period is generated, the signal processor 400 counts the generation period of the first interrupt INT1, and adds or subtracts a constant of a fixed quantization step according to the first control signal POL so as to demodulate discontinuously a precise signal whenever the original signal $[W0 \cdot t + m(t)]$ is changed at every $\pi/2$ period. When the phase relationship of the two signals as shown by IP1-IP3 in FIG. 18A-c is changed, the third control signal INV is generated to maintain the preceding value without the immediate addition or subtraction of a constant. Namely, the flip-flop 313 for outputting the second control signal POL of the preceding quantization step by the first interrupt INT1 produces the high signal when the phase relationship is changed. The output of the flip-flop 313 and the second control signal POL as shown by 7K are exclusive-OR-operated by the gate 314 to compensate the demodulated signal by maintaining the preceding quantization step when the phase relationship is changed at demodulation. This is to maintain the same relation as the general sampling procedure.

The processor 401 of the signal processor 400 processes digital signals, and is embodied by the commercial chip TMS320C25 according to the present invention. In order to digitally demodulate a frequency- or phase-modulated RF signal, the processor 401 stores the quantization information according to the first control signal POL when the interface 300 generates the first interrupt INT1 as shown in FIGS. 18A-f and 18B-b, and according to the second interrupt INT2 of the sampling signal as shown in FIG. 18B-c accumulates the stored quantization information to demodulate the signal by interpolation. Namely, the first interrupt INT1 as shown in FIGS. 18A-f and 18B-b represents one quantization step of the modulated signal is produced in demodulation, and the second interrupt INT2 as shown in FIG. 18B-c in the sampling period. The second interrupt INT2 has priority orer first interrupt INT1 in processing. The demodulation is performed according to the second interrupt.

With reference to FIG. 12, the processing flow when the first interrupt INT1 is generated will be explained. When the interface 300 generates the first interrupt INT1 as shown in FIGS. 18A-f and 18B-b, the processor 401 recognizes the signal, the counter 402 ends counting the time of the first interrupt INT1, is cleared, and the latch 403 stores the value counted by the counter 402 during the period CV of the first interrupt INT1 into a buffer of the processor 401 as shown in FIG. 17a. The processor 401 reads the variable phase information as shown in FIG. 15, which information represents represent the first to third control signals POL, NR, INV of interface 300 at the step A1 when the first interrupt INT1 is generated, and the time counted values C0-C7 during the period of the first interrupt INT1 at the step just preceding the step A1.

At the step A2 the variable phase information is stored into a temporary register. After performing step A2, step A3 detects the D9 bit signal as the second control signal NR of the information in FIG. 15 to determine whether the first interrupt INT1 is normal. If the first interrupt is abnormal (NR=0), the inputted information is neglected, returning to the preceding step. If the first interrupt is normal (NR=1), the step A4 is carried out to store, into the index 3 of the active buffer as shown in FIG. 16A (Index 3: the address of the first buffer presently in use), the variable phase information stored in the temporary register at the step A2, and the position of the index 3 is increased by one at the step A5 to prepare for the first interrupt INT1. Thereafter, the procedure is returned. Into the first buffer (active buffer) is stored the quantization information, as shown in FIG. 15, produced whenever the first interrupt INT1 is signalled. While the first buffer stores the information, the second buffer (interpolation buffer) demodulates the modulated signal by counting the quantization information stored during the period T of the preceding second interrupt INT2.

As shown in FIGS. 16 and 17, the index 1 represents the initial address of the first buffer, the index 3, the address of the first buffer presently in use, the index 2 the initial address of the second buffer, the index 4, the presently used address of the second buffer, and the index 5, the last address at the moment of the first buffer being converted into the second buffer. Besides, the functions of the first and second buffers interchange with each other when the second interrupt INT2 is generated, which will be explained in the initializing procedure of FIG. 13. If the processor 401 recognizes the second interrupt INT2, produced at every fixed sampling period T, it disables the interrupt (here, the first interrupt INT1), and exchanges the index 1 of the first buffer for the index 2 of the second buffer in order to interchange the functions of the first and second buffers at the step B2. At the step B2, the index 5 is designated to store the end point of one sampling period T in the index 3 as the present address of the preceding first buffer (the last address due to the generation of the second interrupt INT2). At the step B4, the index 3 is designated into the position of the present first buffer to prepare for receiving the first information. At the step B5, the information of the index 5 is stored into the index position 1-1. After the index 4 as the presently used address of the second buffer is placed in the position (index 2-1) of the address just preceding index 2 as the initial address to designated the starting point of the interpolation at the step B6, the interrupt disabled in the step B1 is enabled to end by the second interrupt INT2, the initializing procedure for interchanging the functions of the first and second buffer with each other. At the following step B8, the interpolation procedure as shown in FIG. 14 will be explained with reference to FIGS. 17 and 18B. At the step E1, the position of t1 is obtained by subtracting from the sampling period T the content of the index 4 (index position 2-1) at the present positioning address of the second buffer ($t1 = T - index\ 2\text{-}1$). Here, the content designated by the index 4 is the inputted value of the final first interrupt INT1 in the preceding sampling period. At the step E2, the position of t2 is obtained by adding the content of the index 2 to the position of t1. ($t2 = t1 +$ the content of index 2). At the step E3, t1 is divided by t2. (t1/t2). At the step E4, the delta value of the interpolation is obtained in the form of $t1/t2 \times step$, wherein the step is the quantization step QS of a certain extent. Then, the third control signal INV as shown by Y1-Y3 in FIG. 18A-g, is detected whether the phase relationship is changed. If the phase relationship is changed, the step E6 is carried out to neglect the value Δ of the interpolation as zero, returning to the procedure. If the phase relationship is not changed, the step E7 is carried out to detect whether the information of the next address position represents the positive phase relationship by the first control signal POL:D8 with reference to the variable phase information. At the step E7, if the positive phase relationship is represented, the procedure is returned, while if the negative phase relationship is represented, the value of the interpolation is put into the negative phase relationship, and the procedure is returned. After obtaining the value of the interpolation at the step B8, the step B9 is carried out to demodulate the modulated signal by adding the value of the interpolation to the accumulation step value of the preceding sampling period T. At the step B10, the average value of the direct current component is subtracted from the accumulated value of the quantization step QS during the preceding sampling period, so that the final output RXD as shown by Eq.(4) is obtained to compensate the direct current level.

$$RXD = SMPL - KA \qquad (4)$$

wherein
RXD: the final demodulated signal output,
K: constant,
A: DC average of the output,
SMPL: the demodulated signal output prior to DC compensation.

After the direct current level is compensated at the step B10, the content of the used address (index 4) of the interpolation buffer is cleared at the step B11, and the step B12 is carried out to increase the address of the interpolation buffer, thereby designating the next address. The step B13 is carried out to detect whether the phase relationship is changed in the content of the next address. If the phase relationship is changed to the negative direction from the positive direction or vice versa, the value of the quantization step QS is neither increased or decreased. If the phase relationship is not changed, the step B14 is carried out to detect the positive phase relationship. If the phase relationship is in the negative direction at the step B14, the step B15 is carried out to subtract one quantization step from the accumulated value of quantization step. If the phase relationship is in the positive direction, the step B16 is carried out to add one quantization step to the accumulated value of the quantization step. When the phase relationship is changed in the step B13 the step B17 is carried out after the step B15 or B16, it is detected whether the presently used address of the interpolation buffer is the index 5. If not, the quantization information needs to be accumulated in the interpolation buffer, and therefore, the step B11 is again carried out to repeat accumulation of the next information. When the presently used address index 4 of the interpolation buffer is the index 5 of the final address in the step B17, the step B18 is carried out to calculate the direct current level for the sampling period as given by an equation(5), finishing the second interrupt routine.

$$A = a \cdot A + b \cdot RXD \qquad (5)$$

wherein,
a: time constant of LPF
b: dampening constant of LPF input
A: average value of DC component
RXD: received input data Namely, after the demodulated signal of the present state is applied to the low pass filter LPF to calculate the direct current level, the value of the direct current component as given by Eq.(5) is subtracted from the demodulated signal of the next state to maintain a constant direct current level.

Subsequently, the procedure for demodulating the modulated signal by digitally converting every π/4 phase signal from the I and Q channels will be explained. Because the procedure for digitally demodulating the modulated signal by using every π/4 phase change signal is the same as the demodulation by every π/2 phase-digital conversion described above, the remaining parts except the phase-digital converter 200 of FIG. 19 and the interface 300 of FIG. 21 are unchanged, and marked with the same reference numerals.

FIG. 19 illustrates that modulo π/4 phase is digitally converted when the phases of the signals I(t) and Q(t) as shown by 20a and 20b in FIG. 20 are digitally converted. The comparator 205 may digitally convert the phase change of every $m\pi (m=0,1,2,\ldots)$ (0°: PD11) as shown by 20C, the comparator 206 the phase change of every $(m+1)\pi/4$ (m=0,1,2,...) (45°: PD12) as shown by 20d, the comparator 207 the phase change of every $(m+2)\pi/4$ (m=0,1,2,...) (90°: PD13) as shown 20e, and the comparator 208 the phase change of every $(m+3)\pi/4$ (m=0,1,2,...) (135°: PD14) as shown by 20f. The logic levels of PD11-PD14 as shown by 20c-20f present the changes of the phase relationship. The four phase signals are simultaneously detected to determine the changing direction of every π/4 signal. Hence, the positive phase relationship repeats the eight logic levels in the form of 1000→1100→1110→1111→0111→0011→0001→0000, while the negative phase relationship repeats the eight logic levels in the form of 0000→0001→0011→0111→1111→1110→1100→1000. The logic levels are illustrated in FIG. 22.

The interface 300 is constructed as shown in FIG. 21, so that every π/4 phase signal changes may be converted into digital data as shown in FIG. 19. The flip-flops 351-354 for receiving every $\pi/4$ phase-digital conversion signals through the comparators 205-208 shown in FIG. 19, output the signals PD11-PD14 synchronized with the clock 205, while the flip-flops 355-358 output the signal delayed by one clock pulse by the clock 205. Consequently, there occurs a phase difference of one clock pulse between the lines N1-N4 and N5-N8, of which two signals having a phase difference of one clock pulse are exclusive-OR-operated by the gates 359-362. The gates 359-362 detect the moment of each phase change, which enables the gate 363 to generate the first interrupt INT1 for the moment of every $\pi/4$ phase change. In order for the phase of the preceding state, the flip-flops 364-367 produce the outputs of the flip-flops 355-358 synchronized with the output of the gate 363, the relationship is as represented in Tables 4 and 5. The Table 4 represents the signal form at every $\pi/4$ phase change of the present state of the line N1-N4, and the signal form at every $\pi/4$ phase change of the preceding state of the preceding state of the line N11-N14 in the negative phase moving direction as shown by 22A in FIG. 22.

TABLE 4

| N1 | N2 | N3 | N4 | N11 | N12 | N13 | N14 |
|---|---|---|---|---|---|---|---|
| 1 | 0 | 0 | 0 | 0 | 0 | 0 | 0 |
| 1 | 1 | 0 | 0 | 1 | 0 | 0 | 0 |
| 1 | 1 | 1 | 0 | 1 | 1 | 0 | 0 |
| 1 | 1 | 1 | 1 | 1 | 1 | 1 | 0 |
| 0 | 1 | 1 | 1 | 1 | 1 | 1 | 1 |
| 0 | 0 | 1 | 1 | 0 | 1 | 1 | 1 |
| 0 | 0 | 0 | 1 | 0 | 0 | 1 | 1 |
| 0 | 0 | 0 | 0 | 0 | 0 | 0 | 1 |

TABLE 5

| N1 | N2 | N3 | N4 | N11 | N12 | N13 | N14 |
|---|---|---|---|---|---|---|---|
| 1 | 0 | 0 | 0 | 1 | 1 | 0 | 0 |
| 0 | 0 | 0 | 0 | 1 | 0 | 0 | 0 |
| 0 | 0 | 0 | 1 | 0 | 0 | 0 | 0 |
| 0 | 0 | 1 | 1 | 0 | 0 | 0 | 1 |
| 0 | 1 | 1 | 1 | 0 | 0 | 1 | 1 |
| 1 | 1 | 1 | 1 | 0 | 1 | 1 | 1 |
| 1 | 1 | 1 | 0 | 1 | 1 | 1 | 1 |
| 1 | 1 | 0 | 0 | 1 | 1 | 1 | 0 |

In the Tables 4 and 5, the signal of the line N1-N4 represents the present digital values obtained by detecting every $\pi/4$ phase change in the I and Q channels, and the signal of the line N11-N14 the digital values detected at the phase change before one period of the first interrupt INT1. Referring to Tables 4 and 5, there can be seen the following relationship. Namely, the present self phase is same as the change of the preceding phase of the preceding state in the positive phase relationship, while the present self phase is same as the next phase of the preceding phase in the negative phase relationship.

Hence, considering the relationship of Tables 4 and 5, there is observed the relationship as shown in Table 4-1 and 5-1.

TABLE 4-1

PD12n $\oplus$ PD11n-1 = 0
PD13n $\oplus$ PD12n-1 = 0
PD14n $\oplus$ PD13n-1 = 0
PD11n $\oplus$ $\overline{PD14n-1}$ = 0

TABLE 5-1

PD11n $\oplus$ PD12n-1 = 0

TABLE 5-1-continued

PD12n $\oplus$ PD13n-1 = 0
PD13n $\oplus$ PD14n-1 = 0
PD14n $\oplus$ $\overline{PD11n-1}$ = 0

Therefore, in the positive phase relationship, Table 5-1 is employed to make positive the polarity of the first control signal POL, and Table 4-1 to make negative the polarity. According to the present invention, Table 5-1 is employed to make the polarity of the first control signal POL positive in the positive phase relationship and negative in the negative phase relationship.

Thus, if the present self-phase and the preceding self-phase are exclusive-OR-operated respectively by the first gates 368-371, and the present self-phase and the preceding next phase are exclusive-OR-operated respectively by the second gate 372-375, the negative phase change of Table 4 is as shown in Table 6, and the positive phase change of Table 5 as shown in FIG. 7.

TABLE 6

| N15 | N16 | N17 | N18 | N19 | N20 | N21 | N22 |
|---|---|---|---|---|---|---|---|
| 1 | 0 | 0 | 0 | 0 | 0 | 0 | 0 |
| 0 | 0 | 1 | 0 | 0 | 0 | 0 | 0 |
| 0 | 0 | 0 | 0 | 1 | 0 | 0 | 0 |
| 0 | 0 | 0 | 0 | 0 | 0 | 1 | 0 |
| 1 | 0 | 0 | 0 | 0 | 0 | 0 | 0 |
| 0 | 0 | 1 | 0 | 0 | 0 | 0 | 0 |
| 0 | 0 | 0 | 0 | 1 | 0 | 0 | 0 |
| 0 | 0 | 0 | 0 | 0 | 0 | 1 | 0 |

TABLE 7

| N15 | N16 | N17 | N18 | N19 | N20 | N21 | N22 |
|---|---|---|---|---|---|---|---|
| 0 | 1 | 1 | 1 | 0 | 0 | 0 | 0 |
| 1 | 1 | 0 | 0 | 0 | 0 | 0 | 1 |
| 0 | 0 | 0 | 0 | 0 | 1 | 1 | 1 |
| 0 | 0 | 0 | 1 | 1 | 1 | 0 | 0 |
| 0 | 1 | 1 | 1 | 0 | 0 | 0 | 0 |
| 1 | 1 | 0 | 0 | 0 | 0 | 0 | 1 |
| 0 | 0 | 0 | 0 | 0 | 1 | 1 | 1 |
| 0 | 0 | 0 | 1 | 1 | 1 | 0 | 0 |

Furthermore, in order to detect the first control signal POL of the quantization step from the signals as shown in Tables 6 and 7, multiplying the outputs of the first and second gates for receiving the values of the present self phase provides the outputs as shown in Table 8 and 9 respectively in the negative and positive phases.

TABLE 8

| N23 | N24 | N25 | N26 | N27 |
|---|---|---|---|---|
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |

TABLE 9

| N23 | N24 | N25 | N26 | N27 |
|---|---|---|---|---|
| 0 | 1 | 0 | 0 | 1 |
| 1 | 0 | 0 | 0 | 1 |
| 0 | 0 | 0 | 1 | 1 |
| 0 | 0 | 1 | 0 | 1 |
| 0 | 1 | 0 | 0 | 1 |
| 1 | 0 | 0 | 0 | 1 |
| 0 | 0 | 0 | 1 | 1 |

TABLE 9-continued

| N23 | N24 | N25 | N26 | N27 |
|-----|-----|-----|-----|-----|
| 0 | 0 | 1 | 0 | 1 |

Namely, the signal for increasing the quantization step, representing that the polarity of the first control signal POL is positive, is generated by the gate 381 in the positive phase relationship, as shown by N27 in Table 9, while the signal for decreasing the quantization step, representing that the polarity of the first control signal POL is negative, is generated by the gate 381 in the negative phase relationship, as shown by N27 in Table 9.

Hereinafter, the procedure for generating the first control signal POL will be explained in detail. Regardless of the direction of the phase change, all the signals are a kind of gray code, and change the state of only one bit. The polarity is determined, depending on how the changing bit positions of the preceding and the present states are changed. Hence, after the "m"th phase of the present state, and the "m"th phase of the preceding state among $2^{2n}$ phases, are exclusive-OR-operated, and the "m"th phase of the present state and the "m"+1st phase are exclusive-OR-operated, the changes of the two signals obtained by the above two operations are logically multiplied, the first control signal POL being generated for each $\pi/4$ phase change. In this way of detecting the states of n phases, the polarity of the first control signal POL is obtained. (Here, the "m"th phase indicates an arbitrarily chosen phase). Also is detected by extracting the second control signal NR whether the phase moves normally step by step toward the increasing or decreasing direction. If the phase moves toward the increasing direction normally step by step, the first gates 368-371 produce the outputs as shown in Table 10, which outputs are presented as shown in Table 11. If the phase moves toward the decreasing direction step by step, the first gates 368-371 produce the outputs as shown in Table 12, which outputs are represented as shown in Table 13.

TABLE 10

| N15 | N17 | N19 | N21 |
|-----|-----|-----|-----|
| 0 | 1 | 0 | 0 |
| 0 | 0 | 1 | 0 |
| 0 | 0 | 0 | 1 |
| 1 | 0 | 0 | 0 |
| 0 | 1 | 0 | 0 |
| 0 | 0 | 1 | 0 |
| 0 | 0 | 0 | 1 |
| 1 | 0 | 0 | 0 |

TABLE 11

| N31 | N32 | N33 | N34 | N35 | N36 | N37 |
|-----|-----|-----|-----|-----|-----|-----|
| 0 | 0 | 1 | 1 | 0 | 1 | 1 |
| 0 | 0 | 1 | 1 | 0 | 1 | 1 |
| 1 | 1 | 0 | 0 | 1 | 0 | 1 |
| 1 | 1 | 0 | 0 | 1 | 0 | 1 |
| 0 | 0 | 1 | 1 | 0 | 1 | 1 |
| 0 | 0 | 1 | 1 | 0 | 1 | 1 |
| 1 | 1 | 0 | 0 | 1 | 0 | 1 |
| 1 | 1 | 0 | 0 | 1 | 0 | 1 |

TABLE 12

| N15 | N17 | N19 | N21 |
|-----|-----|-----|-----|
| 1 | 0 | 0 | 0 |
| 0 | 0 | 0 | 1 |

TABLE 12-continued

| N15 | N17 | N19 | N21 |
|-----|-----|-----|-----|
| 0 | 0 | 1 | 0 |
| 0 | 1 | 0 | 0 |
| 1 | 0 | 0 | 0 |
| 0 | 0 | 0 | 1 |
| 0 | 0 | 1 | 0 |
| 0 | 1 | 0 | 0 |

TABLE 13

| N31 | N32 | N33 | N34 | N35 | N36 | N37 |
|-----|-----|-----|-----|-----|-----|-----|
| 1 | 1 | 0 | 0 | 1 | 0 | 1 |
| 1 | 1 | 0 | 0 | 1 | 0 | 1 |
| 0 | 0 | 1 | 1 | 0 | 1 | 1 |
| 0 | 0 | 1 | 1 | 0 | 1 | 1 |
| 1 | 1 | 0 | 0 | 1 | 0 | 1 |
| 1 | 1 | 0 | 0 | 1 | 0 | 1 |
| 0 | 0 | 1 | 1 | 0 | 1 | 1 |
| 0 | 0 | 1 | 1 | 0 | 1 | 1 |

Hereinafter, the procedure for generating the second control signal NR will be explained. Generally, the phase-digital converted output is a kind of gray code, and therefore, only one bit normally changes the state. Hence, the changing state of the bit is detected, or otherwise the abnormality is indicated. Namely, if module $n\pi/2$ (n=1), the first phase and the second phase are exclusive-OR-operated to detect the second control signal NR. If modulo $n\pi/4$ (n=2), the first and fourth phases are exclusive-OR-operated and the second and third phases are NOR-operated so as to detect the states of the first and fourth phases, while the second and third phases are exclusive-OR-operated and the first and fourth phase are NOR-operated so as to detect the states of the second and fourth phases. If modulo $n\pi/8$ (n=3), the first and eighth phases, the second and seventh phases, the third and sixth phases, and the fourth and fifth phases are exclusive-OR-operated in each pair. The remaining phases not exclusive-OR-operated are all NOR- operated as shown in Table 14 so as to detect the first control signal POL for the exclusive-OR-operated phases.

TABLE 14

| XOR | NOR | AND |
|-----|-----|-----|
| 1st phase + 8th phase | 1st phase-8th phase | XOR · NOR |
| 2nd phase + 7th phase | 1st phase, 3rd phase-6th phase, 8th phase | XOR · NOR |
| 3rd phase + 6th phase | 1st phase-2nd phase, 4th phase-5th phase, 7th phase-8th phase | XOR · NOR |
| 4th phase + 5th phase | 1st phase-3rd phase, 6th phase-8th phase | XOR · NOR |

Thus, when representing the increase or decrease of the quantization step depending on the phase modulo $\pi/2^n$ (n=n), the first and $2^n$th phases are exclusive-OR-operated, the second-$2^n$—1th phases NOR-operated, the second and $2^n$—1th phases exclusive-OR-operated, and the first, third-$2^n$—2th, and $2^n$th phases NOR-operated, so as to detect whether the quantization step is normal according to each phase change or not. Also, the first control signal POL of the gate 381 is synchronized with the first interrupt INT1 of the gate 363 through the flip-flop 389 to detect the first control signal POL of the preceding state. The first control signal POL of the preceding state and the present first control signal POL of the gate 381 are exclusive-OR-operated by the gate 390 to extract the third control signal INV.

FIG. 8 is another embodiment for illustrating the interface 300 of every π/2 phase-digital conversion. This embodiment is carried out in the same manner as FIG. 21. Namely, the present π/2 phase-digital signals PD1n and PD2n are synchronized with the first interrupt INT1 to extract the preceding signals PD1n−1 and PD2n−1. The present and preceding self phases are exclusive-OR-operated by the first gates 331 and 333. The present self-phase and the preceding next phase are exclusive-OR-operated by the second gates 332, 334. By the gates 335, 336 for multiplying the outputs of the first and second gates 331-334 the first control signal PDL of the quantization step is obtained, and the outputs of the gates 335, 336 are logically added by the gate 337 to obtain the first control signal for every π/2 phase change. Further, the outputs of the first gates 331, 333 are exclusive-OR-operated to obtain the second control signal NR. The modulated signal is demodulated by using the variable phase information INT1, POL, NR, INV generated at every π/2 phase change after converting into digital data every π/2 phase change signal of the I-channel and the O-channel as described above, which is carried out in the same way as the operating procedure for every π/2 phase change.

Consequently, as apparent from the aforementioned description according to the present invention, the received RF signal is digitally demodulated, so that the dependability of the system is increased. Furthermore, the local oscillation signal having the same frequency as the carrier of the received RF signal, the low frequency IF filter is easily realized (IF=0), thereby resulting in high integration, compactness, lightness and low cost. Besides, because of using only one local oscillation frequency, the frequency deviation between the two signals is detected so that high precision automatic frequency control can be accomplished. In addition, the AM noise and deemphasis characteristic is obtained by limiting the amplitude, and digital signalling after demodulation is performed without using the analog-digital converter.

While the invention has been particularly shown and described with reference to a preferred embodiment, it will be understood by those skilled in the art that modifications in detail may be made without departing from the spirit and scope of the invention.

What is claimed is:

1. A system for digitally demodulating a frequency- or phase-modulated signal including, mixing a carrier wave of a modulated signal and a local oscillation signal to produce first and second analog signals of quadrature-phase intermediate frequency having a phase difference of ninety degrees with each other, said system comprising:
   phase-digital converter means for detecting the variation of a fixed phase period of said first and second analog signals for producing a plurality of first phase-digital signals;
   interface means for producing variable phase information for use in digitally demodulating said frequency or phase modulated signal according to the phase relationship of said first phase-digital signals; and
   a signal processor for storing the variable phase information from said interface, for accumulating said variable phase information during a first sampling internal having fixed period, for digitally demodulating said frequency or phase modulated signal and producing a demodulated signal, and for combining said variable phase information accumulated during the first sampling signal with said demodulated signal during a second sampling signal.

2. A system as claimed in claim 1, wherein said phase-digital converter means produces said plurality of first phase-digital signals by comparing amplitude levels of said first and second analog signals with a fixed reference signal.

3. A system as claimed in claim 2, wherein said fixed reference signal is at ground potential.

4. A system as claimed in claim 2, wherein said plurality of first phase-digital signals produced by said phase-digital converter means differ in phase by π/2 and said phase-digital converter means comprises;
   first comparator means for comparing said first analog signal with said fixed reference signal to produce a first component of said first phase-digital signals for detecting the zero crossing of said first analog signal; and
   second comparator means for comparing said second analog signal with said fixed reference signal to produce a second component of said first phase-digital signals for detecting the zero crossing of said second analog signal.

5. A system as claimed in claim 2, wherein said interface means comprises:
   first means for producing a first interrupt signal from said plurality of first phase-digital signals by comparing a first one of said plurality of phase-digital signals to said first one of said plurality of phase-digital signals delayed by a clock pulse to produce a second interrupt signal, comparing a second one of said plurality of phase-digital signals to said second one of said plurality of phase-digital signals delayed by said clock pulse to produce a third interrupt signal, and combining said second and third interruptsignals to produce said first interrupt signal;
   second means for producing a first control signal by comparing said first one of said plurality of phase-digital signals with said delayed second one of said plurality of phase-digital signals, said delayed second one of said plurality of phase-digital signals being synchronized to said first interrupt signal;
   third means for producing a second control signal by comparing said second one of said plurality of phase-digital signals with said delayed first one of said plurality of phase-digital signals to produce a comparison signal, said delayed first one of said plurality of phase-digital signals being synchronized to said first interrupt signal, and by comparing said first control signal with said comparison signal, and
   fourth means for producing a third control signal by comparing said first control signal to a synchronized first control signal, said synchronized first control signal being produced by synchronizing said first control signal to said first interrupt signal.

6. A system as claimed in claim 5, wherein said second producing means receives said first control signal and synchronizes said first control signal with said first interrupt signal to obtain a preceding first control signal, and performing an exclusive-OR operation on said preceding first control signal and said first control signal to produce said third control signal.

7. A system as claimed in claim 5, wherein said signal processor comprises:

counting means for counting clock pulses between periods of said first interrupt signal produced by said interface means.

latching means for outputting a counted value by said counting means in response to said first interrupt signal; and processing means for digitally demodulating said frequency or phase modulated signal in response to said counted value from said latching means.

8. A system as claimed in claim 1, wherein said plurality of first phase-digital signals produced by said phase-digital converter means differ in phase by $\pi/4$ and said phase-digital converter means comprises:

first comparator means for comparing said first analog signal with a first reference signal to produce a first component of said first phase-digital signals for detecting the zero crossing of said first analog signal;

second comparator means for comparing the amplitude of said first analog signal with the amplitude of an inverted second analog signal to produce a second component of said first phase-digital signals;

third comparator means for comparing said second analog signal with a second reference signal to produce a third component of said first phase-digital signals for detecting the zero crossing of said second analog signal; and fourth comparator means for comparing the amplitudes of said first and second analog signals to produce a fourth component of said first phase-digital signals.

9. A method for digitally demodulating a frequency- or phase-modulated signal by using first and second analog signals of a quadrature phase intermediate frequency a phase difference of 90° with respect to each other, comprising the steps of:

detecting a variation, during a fixed phase period, of said first and second analog signals, and converting said first and second analog signals into phase digital data;

producing from said phase digital data variable phase information according to a phase relationship of said phase digital data for use in demodulating said frequency or phase modulated signal;

storing said variable phase information and accumulating said variable phase information in response to a first sampling signal;

demodulating said frequency- or phase-modulated signal for producing a demodulated signal; and combining said variable phase information accumulated during the first sampling signal with said demodulated signal in response to a second sampling signal.

10. A method as claimed in claim 9, characterized in that said steps of detecting and converting said first and second analog signals to phase digital data is performed at a fixed phase interval of modulo $\pi 2^n$ (n = 1,2,3,4 ...), wherein n establishes the fixed phase interval of said detecting and converting step, said detecting and converting steps preserving the relative phase of said first and second analog signals.

11. A method as claimed in claim 10, wherein said producing step further comprises the steps of:

detecting from said phase digital data a variation point of each period to produce a first interrupt signal;

generating from said phase digital data, a first control signal representing increases and decreases in phase rotation of said first and second analog signals;

generating a second control signal representing whether said phase rotation increases or decreases normally; and generating a third control signal by discriminating said phase rotation's polarity.

12. A method as claimed in claim 11, wherein said step for dmeodulating- the frequency or phase- modulated signal comprises the steps of:

adding the accumulated variable phase information to the demodulated signal to produce a sum signal;

interpolating said sum signal;

filtering said demodulated signal; and subtracting said filtered demodulated signal from said interpolated signal to produce said demodulated signal.

13. A system for digitally demodulating a frequency- or phase-modulated signal, comprising:

an antenna for receiving a first modulated ratio frequency signal;

a low noise amplifier for amplifying the first signal;

a local oscillator for generating a second signal having a frequency equal to that of the carrier wave of said first signal;

a phase shifter for shifting the phase of the local oscillation frequency of said second signal producing a third signal having a phase difference of ninety degrees from said second signal;

first means for mixing said first and second signals producing a fourth signal;

second means for mixing said first and third signals producing a fifth signal;

third means for filtering said fourth signal to a one-half bandwidth of the channel band of said first signal;

fourth means for filtering said fifth signal to a one-half bandwidth of the channel band of said first signal;

phase-digital converter means for detecting the variation of a fixed phase period of said filtered fourth and fifth signals for producing a plurality of first phase-digital signals interface means for producing variable phase information for use in digitally demodulating said frequency or phase modulated signal according to the phase relationship of said first phase-digital signals; and a signal processor for storing the variable phase information from said interface, for accumulating said variable phase information during a first sampling interval having fixed period, for digitally demodulating said frequency- or phase-modulated signal and producing a demodulated signal, and for combining said variable phase information accumulated during the first sampling signal with said demodulated signal during a second sampling signal.

14. A system for digitally demodulating a frequency- or phase-modulated signal, comprising:

an antenna for receiving a first modulated radio frequency signal;

a low noise amplifier for amplifying the first signal;

a local oscillator for generating a second signal having a frequency equal to that of the carrier wave of said first signal signal;

a phase shifter for shifting the phase of the local oscillation frequency of said second signal producing a third signal having a phase difference of ninety degrees from said second signal;

first means for mixing said first and second signals producing a fourth signal;

second means for mixing said first and third signals producing a fifth signal;

third means for filtering said fourth signal to a one-half bandwidth of the channel band of said first signal;

fourth means for filtering said fifth signal to a one-half bandwidth of the channel band of said first signal;

phase-digital converter means for detecting the variation of a fixed phase period of said filtered fourth and fifth signals for producing a plurality of first phase-digital signals, wherein said phase-digital converter means produces said plurality of first phase-digital signals by comparing amplitude levels of said first and second analog signals with a fixed reference signal;

interface means for producing variable phase information for use in digitally demodulating said frequency or phase modulated signal according to the phase relationship of said first phase-digital signals; and a signal processor for storing the variable phase information from said interface, for accumulating said variable phase information during a first sampling interval having fixed period, for digitally demodulating said frequency or phase modulated signal and producing a demodulated signal, and for combining said variable phase information accumulated during the first sampling signal with said demodulated signal during a second sampling signal.

* * * * *

UNITED STATES PATENT AND TRADEMARK OFFICE
CERTIFICATE OF CORRECTION

PATENT NO. : 5,128,966
DATED : 7 July 1992
INVENTOR(S) : Se-Hyun BANG

It is certified that error appears in the above-identified patent and that said Letters Patent is hereby corrected as shown below:

IN THE CLAIMS

Claim 5, Column 22, Line 38, change "interruptsignals" to --interrupt signals--.

Claim 12, Column 24, Line 10, change "dmeodulating" to --demodulating--.

Col. 24, claim 14, line 65, delete "signal" (second occurrence)

Signed and Sealed this

Fifth Day of October, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,128,966
DATED : July 7, 1992
INVENTOR(S) : Se-Hyun Bang It is certified that error appears in the above-identified patent and that said Letters Patent is hereby corrected as shown below:

On the title page, insert item [30] as follows:

--[30] FOREGN APPLICATION PRIORITY DATA
Feb. 15, 1988 (KR) Rep. of Korea ..........1088-1702 --.

Signed and Sealed this

Thirtieth Day of November, 1993

Attest:

BRUCE LEHMAN

*Attesting Officer*  *Commissioner of Patents and Trademarks*